United States Patent
Moschiano et al.

(10) Patent No.: US 11,605,588 B2
(45) Date of Patent: Mar. 14, 2023

(54) MEMORY DEVICE INCLUDING DATA LINES ON MULTIPLE DEVICE LEVELS

(71) Applicant: Micron Technology, Inc., Boise, ID (US)

(72) Inventors: Violante Moschiano, Bacoli (IT); Paolo Tessariol, Montebelluna (IT); Aaron Yip, Los Gatos, CA (US); Naveen Kaushik, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/723,758

(22) Filed: Dec. 20, 2019

(65) Prior Publication Data

US 2021/0193570 A1    Jun. 24, 2021

(51) Int. Cl.
*H01L 23/522*    (2006.01)
*H01L 23/528*    (2006.01)
(Continued)

(52) U.S. Cl.
CPC .... *H01L 23/5226* (2013.01); *H01L 21/76816* (2013.01); *H01L 21/76877* (2013.01);
(Continued)

(58) Field of Classification Search
CPC .............. H01L 23/5226; H01L 23/528; H01L 27/1156; H01L 27/11524; H01L 27/11582; H01L 27/1157
See application file for complete search history.

(56) References Cited

U.S. PATENT DOCUMENTS

| | | |
|---|---|---|
| 5,453,955 A | 9/1995 | Sakui et al. |
| 6,058,044 A | 5/2000 | Sugiura et al. |

(Continued)

FOREIGN PATENT DOCUMENTS

| | | |
|---|---|---|
| CN | 102237368 A | 11/2011 |
| CN | 102623456 A | 8/2012 |

(Continued)

OTHER PUBLICATIONS

"Korean Application Serial No. 10-2015-7013601, Notice of Preliminary Rejection dated Dec. 18, 2019", w/ English Translation, 9 pgs.

(Continued)

*Primary Examiner* — Didarul A Mazumder
*Assistant Examiner* — Gustavo G Ramallo
(74) *Attorney, Agent, or Firm* — Schwegman Lundberg & Woessner, P.A.

(57) ABSTRACT

Some embodiments include apparatuses and methods of forming the apparatuses. One of the apparatuses includes a first pillar of a first memory cell string; a second pillar of a second memory cell string; a first conductive structure extending in a first direction, the first conductive structure located over and in electrical contact with the first pillar; a second conductive structure extending in the first direction, the second conductive structure located over and in electrical contact with the second pillar; a select gate coupled to the first and second memory cell strings; a first data line located on a first level of the apparatus and extending in a second direction, the first data line located over the first conductive structure and in electrical contact with the first conductive structure; and a second data line located on a second level of the apparatus and extending in the second direction, the second data line located over the second conductive struc- (Continued)

ture and in electrical contact with the second conductive structure.

9 Claims, 14 Drawing Sheets

(51) Int. Cl.
H01L 27/1157 (2017.01)
H01L 27/11524 (2017.01)
H01L 27/11556 (2017.01)
H01L 21/768 (2006.01)
H01L 27/11582 (2017.01)

(52) U.S. Cl.
CPC ........ H01L 23/528 (2013.01); H01L 27/1157 (2013.01); H01L 27/11524 (2013.01); H01L 27/11556 (2013.01); H01L 27/11582 (2013.01)

(56) References Cited

U.S. PATENT DOCUMENTS

| | | |
|---|---|---|
| 6,304,479 B1 | 10/2001 | Vollrath et al. |
| 6,751,124 B2 | 6/2004 | Lee |
| 7,243,185 B2 | 7/2007 | See et al. |
| 7,355,237 B2 | 4/2008 | Lutze et al. |
| 7,807,533 B2 | 10/2010 | Lutze et al. |
| 7,978,517 B2 | 7/2011 | Isobe |
| 8,294,131 B2 | 10/2012 | Kim et al. |
| 8,368,137 B2 | 2/2013 | Moklesi et al. |
| 8,369,142 B2 | 2/2013 | Futatsuyama |
| 8,441,855 B2 | 5/2013 | Liu |
| 8,614,918 B2 | 12/2013 | Sakui |
| 8,619,471 B2 | 12/2013 | Tanzawa |
| 8,780,631 B2 | 7/2014 | Tanzawa |
| 8,811,084 B2 | 8/2014 | Tanzawa |
| 8,890,233 B2 | 11/2014 | Hung et al. |
| 8,902,663 B1 | 12/2014 | Or-Bach et al. |
| 9,036,421 B2 | 5/2015 | Liu |
| 9,093,152 B2 | 7/2015 | Sakui et al. |
| 9,147,493 B2 | 9/2015 | Sakui |
| 9,159,736 B2 | 10/2015 | Vu et al. |
| 9,711,224 B2 | 7/2017 | Tanzawa |
| 9,734,915 B2 | 8/2017 | Sakui |
| 10,242,746 B2 | 3/2019 | Sakui et al. |
| 10,643,714 B2 | 5/2020 | Sakui |
| 11,075,163 B2 | 7/2021 | Sakui et al. |
| 2005/0180186 A1 | 8/2005 | Lutze et al. |
| 2007/0096254 A1 | 5/2007 | Ritter et al. |
| 2007/0158736 A1 | 7/2007 | Arai et al. |
| 2008/0084729 A1 | 4/2008 | Cho et al. |
| 2008/0157169 A1 | 7/2008 | Yuan |
| 2008/0160680 A1 | 7/2008 | Yuan |
| 2009/0067236 A1 | 3/2009 | Isobe et al. |
| 2009/0238005 A1 | 9/2009 | You |
| 2009/0251962 A1 | 10/2009 | Yun et al. |
| 2009/0268523 A1 | 10/2009 | Maejima |
| 2010/0003660 A1 | 2/2010 | Shinmyoh et al. |
| 2010/0322000 A1 | 12/2010 | Shim |
| 2011/0002178 A1 | 1/2011 | Hwang et al. |
| 2011/0013458 A1 | 1/2011 | Seol |
| 2011/0266604 A1 | 11/2011 | Kim et al. |
| 2011/0299314 A1 | 12/2011 | Samachisa et al. |
| 2011/0310673 A1 | 12/2011 | Cho et al. |
| 2012/0001249 A1 | 1/2012 | Alsmeier et al. |
| 2012/0044733 A1 | 2/2012 | Scheuerlein |
| 2012/0063231 A1 | 3/2012 | Wood et al. |
| 2012/0081958 A1 | 4/2012 | Lee et al. |
| 2012/0140549 A1 | 6/2012 | Maejima |
| 2012/0257433 A1 | 10/2012 | Yan et al. |
| 2014/0119117 A1* | 5/2014 | Sakui ............... G11C 11/5671 365/185.05 |
| 2014/0369116 A1* | 12/2014 | Sakui ............... G11C 16/0483 365/185.02 |
| 2015/0162084 A1 | 6/2015 | Morooka et al. |
| 2015/0333001 A1 | 11/2015 | Sakui et al. |
| 2016/0019970 A1 | 1/2016 | Sakui |
| 2017/0365615 A1 | 12/2017 | Dennison et al. |
| 2018/0068794 A1 | 3/2018 | Lee et al. |
| 2018/0122482 A1 | 5/2018 | Sakui |
| 2018/0295715 A1 | 10/2018 | Tsukuda et al. |
| 2019/0237475 A1 | 8/2019 | Jung et al. |
| 2019/0279722 A1 | 9/2019 | Sakui |
| 2021/0126007 A1 | 4/2021 | Clampitt et al. |

FOREIGN PATENT DOCUMENTS

| | | |
|---|---|---|
| CN | 104813406 A | 7/2015 |
| CN | 104813406 B | 4/2020 |
| CN | 111402941 A | 7/2020 |
| CN | 112713148 A | 4/2021 |
| CN | 113012740 A | 6/2021 |
| KR | 1020110132820 A | 12/2011 |
| KR | 101102548 B1 | 1/2012 |
| KR | 20120013971 A | 2/2012 |
| KR | 20120084268 A | 7/2012 |
| KR | 20120122673 A | 11/2012 |
| TW | 201432693 A | 8/2014 |
| TW | I735404 B | 8/2021 |
| WO | WO-2014066837 A1 | 5/2014 |

OTHER PUBLICATIONS

"Taiwanese Application Serial No. 102138789, First Office Action dated Feb. 14, 2020", w/ English tranlsation, 32 pgs.
U.S. Appl. No. 13/661,498, Restriction Requirement dated Mar. 27, 2014, 7 pgs.
U.S. Appl. No. 13/661,498, Response filed May 7, 2014 to Restriction Requirement dated Mar. 27, 2014, 10 pgs.
U.S. Appl. No. 13/661,498, Non Final Office Action dated Jul. 8, 2014, 14 pgs.
U.S. Appl. No. 13/661,498, Response filed Oct. 8, 2014 to Non Final Office Action dated Jul. 8, 2014, 13 pgs.
U.S. Appl. No. 13/661,498, Final Office Action dated Jan. 2, 2015, 18 pgs.
U.S. Appl. No. 13/661,498, Response to Office Action dated Jan. 2, 2015, 14 pgs.
U.S. Appl. No. 13/661,498, Notice of Allowance dated Mar. 20, 2015, 11 pgs.
U.S. Appl. No. 13/919,599, Non Final Office Action dated Jan. 5, 2015, 9 pgs.
U.S. Appl. No. 13/919,599, Response filed Apr. 1, 2015 to Non Final Office Action dated Jan. 5, 2015, 12 pgs.
U.S. Appl. No. 13/919,599, Notice of Allowance dated May 18, 2015, 9 pgs.
U.S. Appl. No. 14/810,044, Non Final Office Action dated Jul. 25, 2016, 15 pgs.
U.S. Appl. No. 14/810,044, Response filed Oct. 25, 2016 to Non Final Office Action dated Jul. 25, 2016, 12 pgs.
U.S. Appl. No. 14/810,044, Final Office Action dated Mar. 3, 2017, 15 pgs.
U.S. Appl. No. 14/810,044, Response filed Jun. 5, 2017 to Final Office Action dated Mar. 3, 2017, 9 pgs.
U.S. Appl. No. 14/810,044, Advisory Action dated Jul. 3, 2017, 3 pgs.
U.S. Appl. No. 14/810,044, Response filed Aug. 3, 2017 to Final Office Action dated Mar. 3, 2017, 11 pgs.
U.S. Appl. No. 14/810,044, Advisory Action dated Aug. 31, 2017, 3 pgs.
U.S. Appl. No. 14/810,044, Non Final Office Action dated Nov. 3, 2017, 17 pgs.
U.S. Appl. No. 14/810,044, Response filed Jan. 31, 2018 to Non Final Office Action dated Nov. 3, 2017, 11 pgs.
U.S. Appl. No. 14/810,044, Final Office Action dated Aug. 29, 2018, 18 pgs.
U.S. Appl. No. 14/810,044, Response filed Jan. 29, 2019 to Final Office Action dated Aug. 29, 2018, 11 pgs.
U.S. Appl. No. 14/810,044, Non Final Office Action dated May 13, 2019, 13 pgs.

(56) References Cited

OTHER PUBLICATIONS

U.S. Appl. No. 14/810,044, Response filed Oct. 15, 2019 to Non-Final Office Action dated May 13, 2019, 14 pgs.
U.S. Appl. No. 14/810,044, Final Office Action dated Nov. 7, 2019, 14 pgs.
U.S. Appl. No. 14/867,948, Non Final Office Action dated Jan. 21, 2016, 9 pgs.
U.S. Appl. No. 14/867,948, Response filed Apr. 21, 2016 to Non Final Office Action dated Jan. 21, 2016, 9 pgs.
U.S. Appl. No. 14/867,948, Notice of Allowance dated Aug. 19, 2016, 9 pgs.
U.S. Appl. No. 14/867,948, Notice of Allowance dated Dec. 19, 2016, 11 pgs.
U.S. Appl. No. 14/867,948, Notice of Allowance dated Apr. 5, 2017, 10 pgs.
U.S. Appl. No. 15/676,659, Non Final Office Action dated Feb. 23, 2018, 15 pgs.
U.S. Appl. No. 15/676,659, Response filed May 23, 2018 to Non-Final Office Action dated Feb. 23, 2018, 9 pgs.
U.S. Appl. No. 15/676,659, Notice of Allowance dated Aug. 1, 2018, 10 pgs.
U.S. Appl. No. 15/676,659, Notice of Allowability dated Aug. 29, 2018, 2 pgs.
U.S. Appl. No. 15/676,659, Notice of Allowance dated Nov. 5, 2018, 11 pgs.
U.S. Appl. No. 15/676,659, Notice of Allowability dated Feb. 6, 2019, 2 pgs.
U.S. Appl. No. 16/275,038, Preliminary Amendment filed Jun. 5, 2019, 8 pgs.
U.S. Appl. No. 16/275,038, Non Final Office Action dated Aug. 21, 2019, 22 pgs.
U.S. Appl. No. 16/275,038, Response filed Nov. 20, 2019 to Non-Final Office Action dated Aug. 21, 2019, 11 pgs.
"A 34 MB/sMLC Write Throughput 16 Gb NAND With All BitLineArchitecture on 56 nm Technology", IEEE Journal of Solid-State Circuits, 44(1), (Jan. 2009), 186-193.
"Chinese Application Serial No. 201380062063.3, Office Action dated May 13, 2019", w/ English translation,21 pgs.
"Chinese Application Serial No. 201380062063.3, Office Action dated Jun. 22, 2018", w/ English translation,21 pgs.
"Chinese Application Serial No. 201380062063.3, Response filed Jul. 26, 2019 to Office Action dated May 13, 2019", w/ English Claims, 34 pgs.
"Chinese Application Serial No. 201380062063.3, Response filed Nov. 7, 2018 to Office Action dated Jun. 22, 2018", w/ English Claims, 24 pgs.
"InternationalApplication Serial No. PCT/US2013/066941, International Preliminary Report on Patentability dated May 7, 2015", 9 pgs.
"InternationalApplication Serial No. PCT/US2013/066941, International Search Report dated Feb. 10, 2014", 3 pgs.
"InternationalApplication Serial No. PCT/US2013/066941, Written Opinion dated Feb. 10, 2014", 7 pgs.
"Taiwanese Application Serial No. 102138789, Decision of Rejection dated Oct. 12, 2018", w/ English translation, 11 pgs.
"Taiwanese Application Serial No. 102138789, Office Action dated Jul. 11, 2017", No English Translation, 12 pgs.
"Taiwanese Application Serial No. 102138789, Office Action dated Nov. 22, 2017", With English Translation, 31 pgs.
"Taiwanese Application Serial No. 102138789, Response filed Feb. 22, 2018to Office Action dated Nov. 22, 2017", w/English Claims, 15 pgs.
"Taiwanese Application Serial No. 102138789, Response filed Apr. 16, 2019to Decision of Rejection dated Oct. 12, 2018", w/ English Claims, 16 pgs.
"Taiwanese Application Serial No. 102138789, Response Filed Oct. 12, 2017 to Office Action dated Jul. 11, 2017", w/English Claims, 13 pgs.
Nakano, H, et al., "A dual layer bitline DRAM array with Vcc/Vss hybrid precharge for multi-gigabitDRAMS", Symposium on VLSI Circuits, Digest of Technical Papers., (Jun. 1996).
"Taiwanese Application Serial No. 102138789, Office Action dated Sep. 22, 2020", w/ English Translation of Search Report, 13 pgs.
"Taiwanese Application Serial No. 102138789, Response filed Jun. 22, 2020 to First Office Action dated Feb. 14, 2020", w/ English Claims, 18 pgs.
U.S. Appl. No. 13/661,498 U.S. Pat. No. 9,093,152, filed Oct. 26, 2012, Multiple Data Line Memory and Methods.
U.S. Appl. No. 14/810,044, filed Jul. 27, 2015, Vertical NAND String Multiple Data Line Memory.
U.S. Appl. No. 13/919,599 U.S. Pat. No. 9,147,493, filed Jun. 17, 2013, Memory Operations in a Shielded Vertically Stacked Data Line Architecture.
U.S. Appl. No. 14/867,948 U.S. Pat. No. 9,734,915, filed Sep. 28, 2015, Shielded Vertically Stacked Data Line Architecture for Memory.
U.S. Appl. No. 15/676,659 U.S. Pat. No. 10,242,746, filed Aug. 14, 2017, Shielded Vertically Stacked Data Line Architecture for Memory.
U.S. Appl. No. 16/275,038 U.S. Pat. No. 10,643,714, filed Feb. 13, 2019, Shielded Vertically Stacked Data Line Architecture for Memory.
U.S. Appl. No. 16/275,038, filed Feb. 13, 2019, Shielded Vertically Stacked Data Line Architecture for Memory.
U.S. Appl. No. 16/664,280, filed Oct. 25, 2019, Semiconductor Device Including Stacked Data Lines.
"Korean Application Serial No. 10-2015-7013601, Notice of Preliminary Rejection dated Dec. 29, 2020", w/ English translation, 11 pgs.
"Korean Application Serial No. 10-2015-7013601, Response filed Mar. 2, 2021 to Notice of Preliminary Rejection dated Dec. 29, 2020", w/ English Claims, 15 pgs.
"Taiwanese Application Serial No. 102138789, Response filed Mar. 25, 2021 to Office Action dated Sep. 22, 2020", w/ English Claims, 17 pgs.
"Korean Application Serial No. 10-2015-7013601, Final Office Action dated Jul. 29, 2021", w/ English translation, 7 pgs.

* cited by examiner

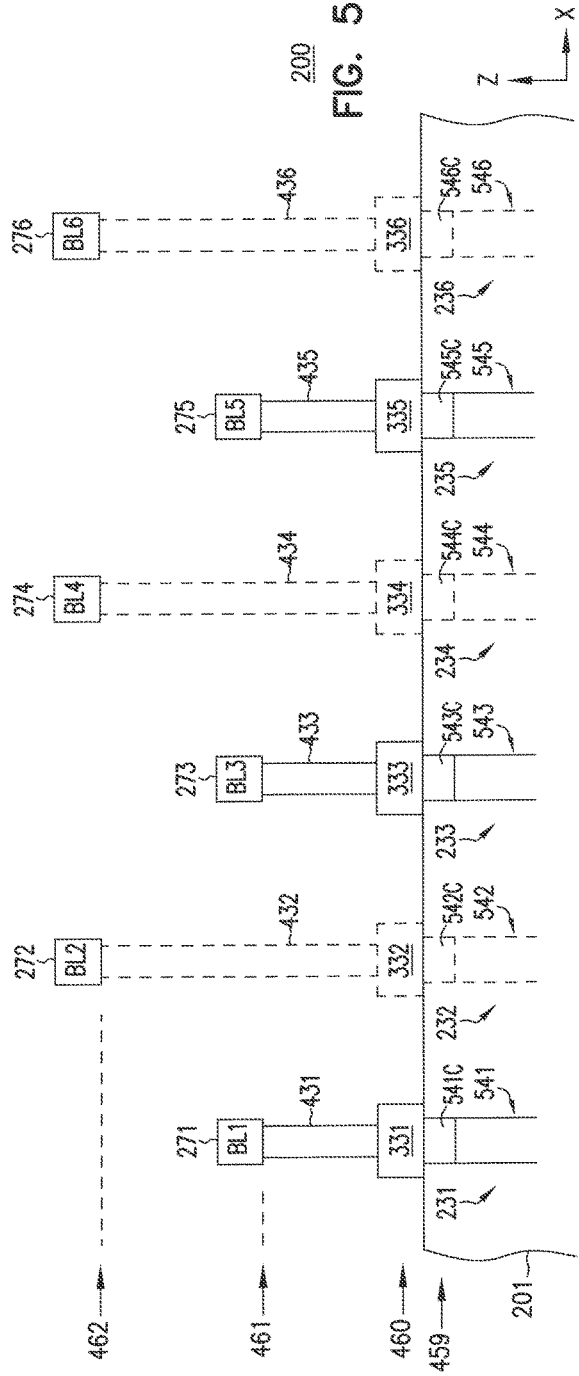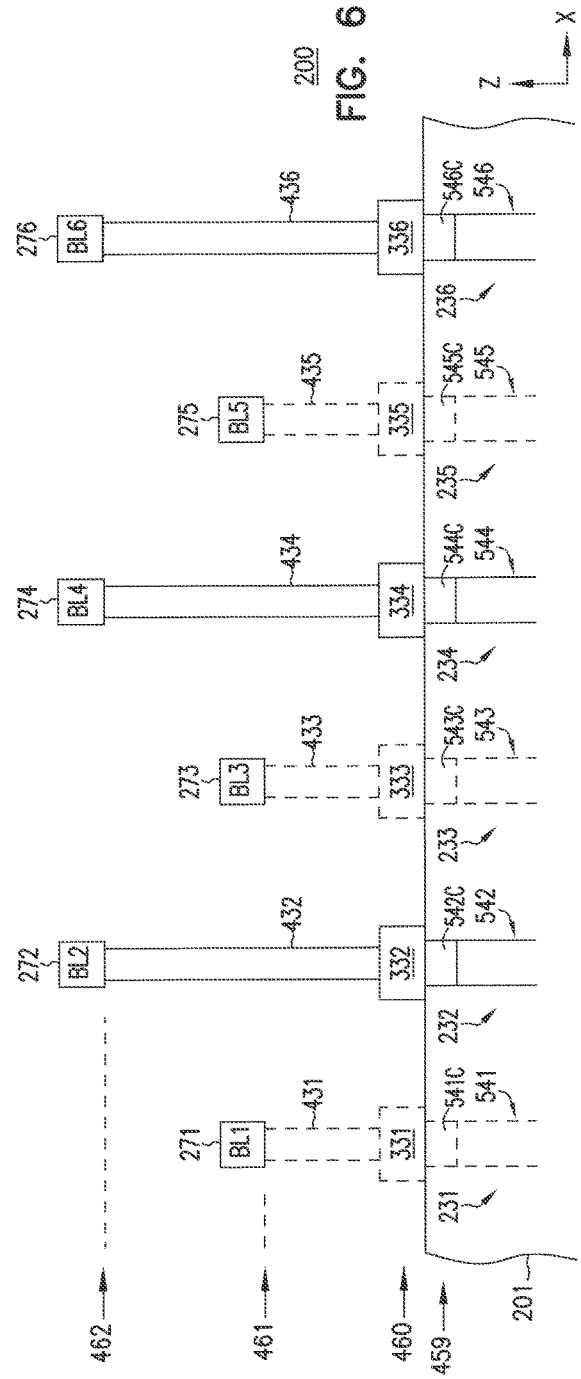

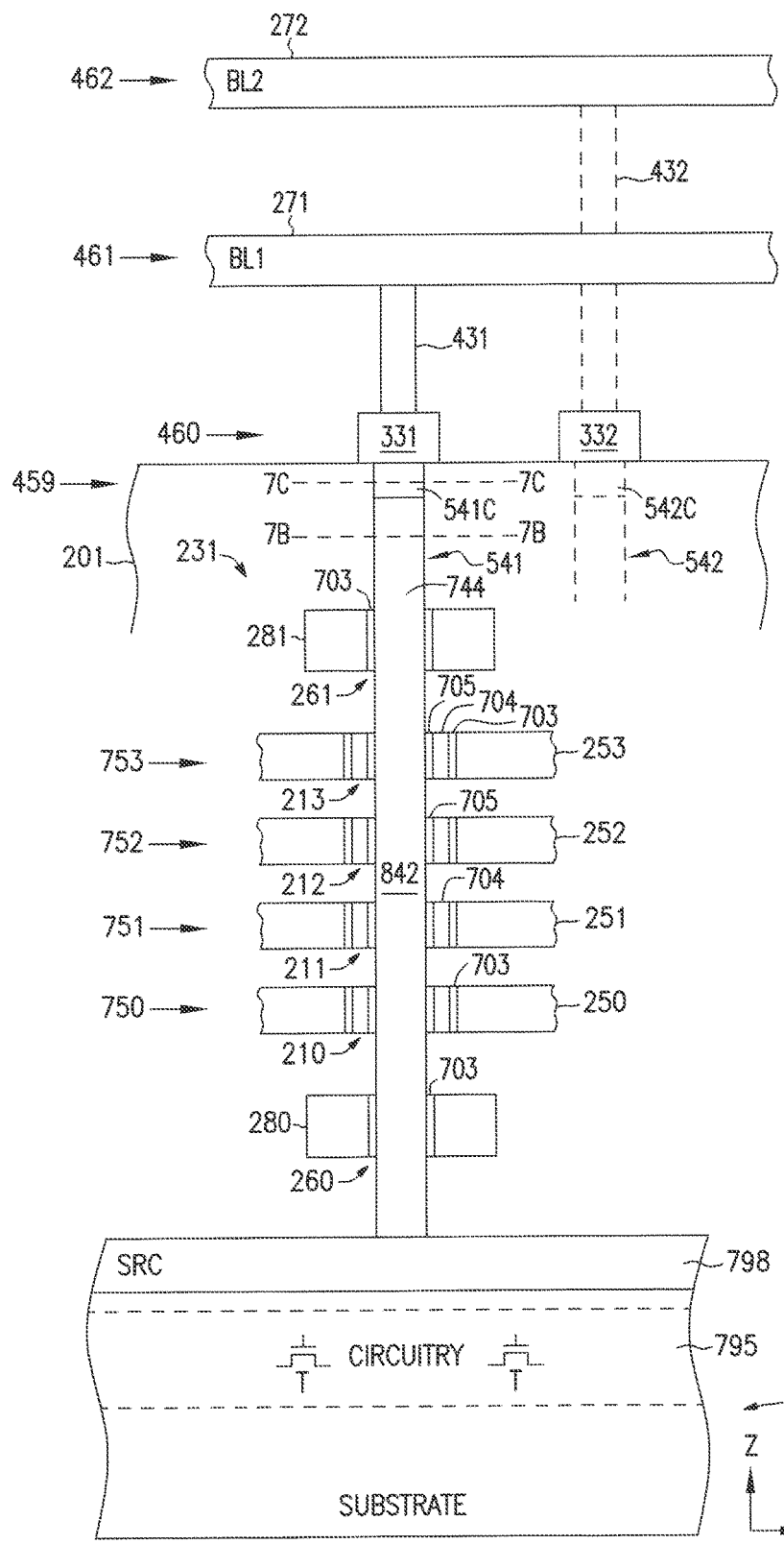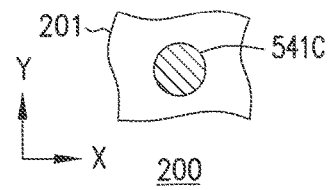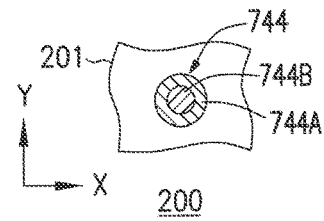
FIG. 7C
FIG. 7B
FIG. 7A

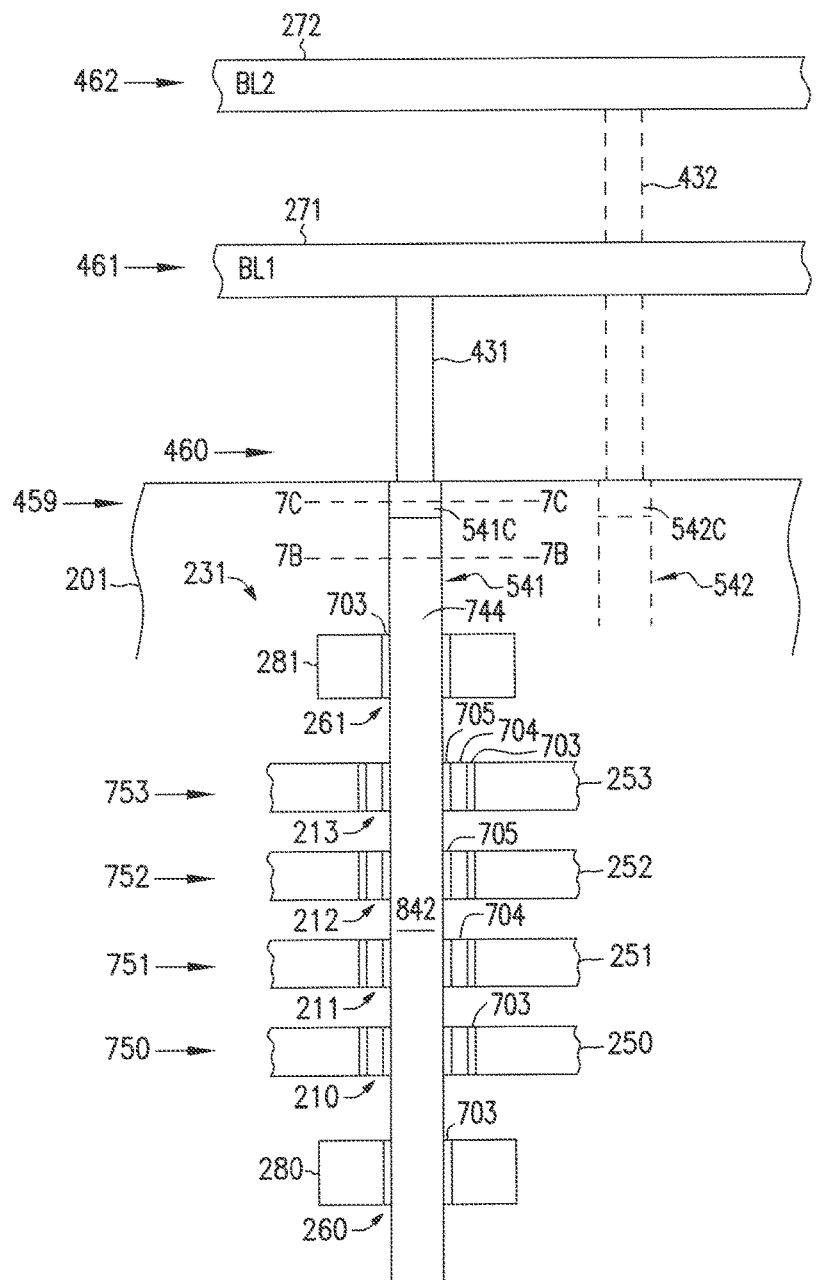
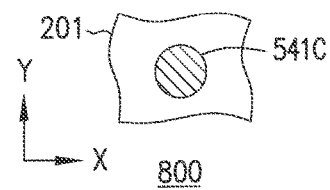
FIG. 9C
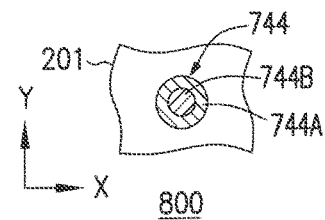
FIG. 9B
FIG. 9A

MEMORY DEVICE INCLUDING DATA LINES ON MULTIPLE DEVICE LEVELS

BACKGROUND

Memory devices are widely used in computers and many electronic items. A memory device often has numerous memory cells to store information and data lines (e.g., bit lines) to carry information (in the form of signals) to and from the memory cells. The data lines are normally formed one next to another in a single level (e.g., layer) of the memory device. As demand for memory cell density increases for a given device size, the number of data lines may also be increased to accommodate for the increased memory cell capacity. In some applications, a smaller device size may be desirable, causing the distance between adjacent data lines to decrease. An increase in the number of data lines for a given area or a decrease in the distance between adjacent data lines may cause undesirable coupling capacitance between adjacent data lines to also increase. An increase in the undesirable coupling capacitance may degrade device performance.

BRIEF DESCRIPTION OF THE DRAWINGS

FIG. 5 shows a side view (e.g., cross-sectional view) of the structure of the memory device of FIG. 3 along line 5-5, according to some embodiments described herein.

FIG. 6 shows a side view (e.g., cross-sectional view) of the structure of the memory device of FIG. 3 along line 6-6, according to some embodiments described herein.

FIG. 7A shows a side view (e.g., a cross section with respect to the X-Z directions) of a portion of the structure of the memory device of FIG. 3 including a structure of a memory cell string having a pillar, according to some embodiments described herein.

FIG. 7B shows a top view (e.g., a cross section with respect to the X-Y plan) of a portion of the pillar along line 7B-7B of FIG. 7A.

FIG. 7C shows a top view (e.g., a cross section with respect to the X-Y plan) of a portion of the pillar along line 7C-7C of FIG. 7A.

FIG. 9A shows a side view (e.g., a cross section with respect to the X-Z directions) of another portion of a structure of the memory device of FIG. 8 including a structure of two memory cell strings and a pillar, according to some embodiments described herein.

FIG. 9B shows a top view (e.g., a cross section with respect to the X-Y plan) of a portion of the pillar along line 9B-9B of FIG. 9A.

FIG. 9C shows a top view (e.g., a cross section with respect to the X-Y plan) of a portion of the pillar along line 9C-9C of FIG. 9A.

DETAILED DESCRIPTION

The techniques described herein include a memory device having data lines formed in multiple levels of the memory device. The structures and formations of the data lines described herein can keep coupling capacitance between adjacent data lines at acceptable values for an increased number of data lines or for a decrease in the distance between adjacent data lines. This can maintain or improve the performance of the memory device described herein. Other improvements and benefits of the described techniques are discussed in detail below with reference to FIG. 1 through FIG. 15.

Figure 1:
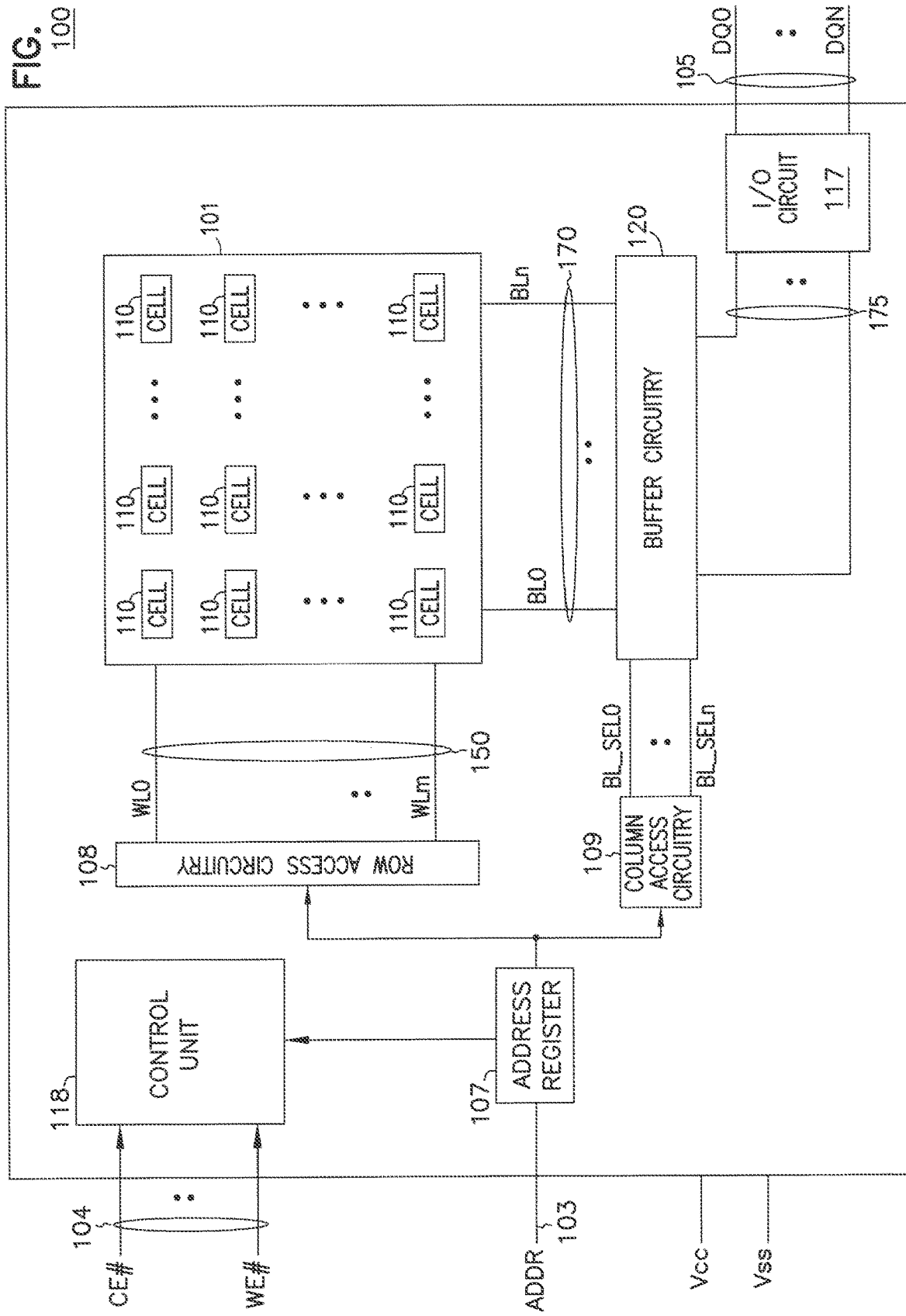
FIG. 1 shows a block diagram of an apparatus in the form of a memory device including data lines, according to some embodiments described herein.

FIG. 1 shows a block diagram of an apparatus in the form of a memory device 100 including data lines 170, according to some embodiments described herein. Memory device 100 can include a memory array (or multiple memory arrays) 101 containing memory cells 110. In the physical structure of memory device 100, memory cells 110 can be arranged vertically (e.g., stacked one over another) over a substrate (e.g., a semiconductor substrate) of memory device 100. Memory cells 110 can include floating gate memory cells, charge trap memory cells, or other types memory cells. Memory cells 110 can include non-volatile memory cells.

Memory device 100 can include access lines 150, which include word lines of memory device 100. Access lines 150 can carry signals (e.g., word line signals) WL0 through WLm. Memory device 100 can use access lines 150 to selectively access memory cells 110.

Data lines 170 can include local data lines (e.g., local bit lines) of memory device 100. Data lines 170 can carry signals (e.g., bit line signals) BL0 through BLn. Memory device 100 can use data lines 170 to exchange information (e.g., data) with memory cells 110.

Memory device 100 can include an address register 107 to receive address information (e.g., address signals) ADDR on lines (e.g., address lines) 103. Memory device 100 can include row access circuitry 108 and column access circuitry 109 (e.g., part of decoder circuitry of memory device 100) that can decode address information from address register 107. Based on decoded address information, memory device 100 can determine which memory cells 110 are to be accessed during a memory operation. Memory device 100 can perform a read operation to read (e.g., sense) information (e.g., previously stored information) in memory cells 110, or a write (e.g., program) operation to store (e.g., program) information in memory cells 110. Memory device 100 can use data lines 170 associated with signals BL0 through BLn to provide information to be stored in memory cells 110 or obtain information read (e.g., sensed) from memory cells 110. Memory device 100 can also perform an erase operation to erase information from some or all of memory cells 110.

Memory device 100 can include a control unit 118 that can be configured (e.g., can include components) to control memory operations of memory device 100 based on control signals on lines 104. Examples of the control signals on lines 104 include one or more clock signals and other signals (e.g., a chip enable signal CE #, a write enable signal WE #) to indicate which memory operation (e.g., read, write, or erase operation) memory device 100 can perform. Control unit 118 can include components, for example, firmware, hardware, or software or any combination of firmware, hardware, and software, to control memory operations of memory device 100. An external device can provide commands on lines 104 to cause memory device 100 to perform a memory operation (e.g., read, write, or erase operation). The external device includes a processor, a memory controller, other types of external devices.

Memory device 100 can include buffer circuitry 120 that can include sense amplifiers and page buffer circuits (e.g., data latches) and other circuit components. Buffer circuitry 120 can respond to signals BL_SEL0 through BL_SELn from column access circuitry 109. Buffer circuitry 120 can be configured to determine (e.g., by sensing) the value of information read from memory cells 110 (e.g., during a read operation) and provide the value of the information to lines (e.g., global data lines) 175. Buffer circuitry 120 can also be configured to use signals on lines 175 to determine the value of information to be stored (e.g., programmed) in memory cells 110 (e.g., during a write operation) based on the values (e.g., voltage values) of signals on lines 175 (e.g., during a write operation).

Memory device 100 can include input/output (I/O) circuitry 117 to exchange information between memory cells 110 and lines (e.g., I/O lines) 105. Signals DQ0 through DQN on lines 105 can represent information read from or stored in memory cells 110. Lines 105 can include conductive nodes within memory device 100 or pins (or solder balls) on a package that contains memory device 100. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

Each of memory cells 110 can be programmed to store information representing a value of at most a single bit, or a value of multiple bits such as two, three, four, or another number of bits. For example, each of memory cells 110 can be programmed to store information representing a binary value "0" or "1" of a single bit. A memory cell that stores single bit per cell is sometimes called a single-level cell. In another example, each of memory cells 110 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A memory cell that can store multiple bits is sometimes called a multi-level cell (or multi-state cell).

Memory device 100 can include a non-volatile memory device, such that memory cells 110 can retain information stored thereon when power (e.g., voltage Vcc, Vss, or both) is disconnected from memory device 100. For example, memory device 100 can be a flash memory device, such as a NAND flash (e.g., 3-directional (3-D) NAND) or a NOR flash memory device, or another kind of memory device, such as a variable resistance memory device (e.g., a phase change memory device or a resistive RAM (Random Access Memory) device). One of ordinary skill in the art may recognize that memory device 100 may include other components, several of which are not shown in FIG. 1 so as not to obscure the example embodiments described herein.

At least a portion of memory device 100 can include structures similar to (or the same as) the structures of any of the memory devices described below with reference to FIG. 2 through FIG. 15.

Figure 2:
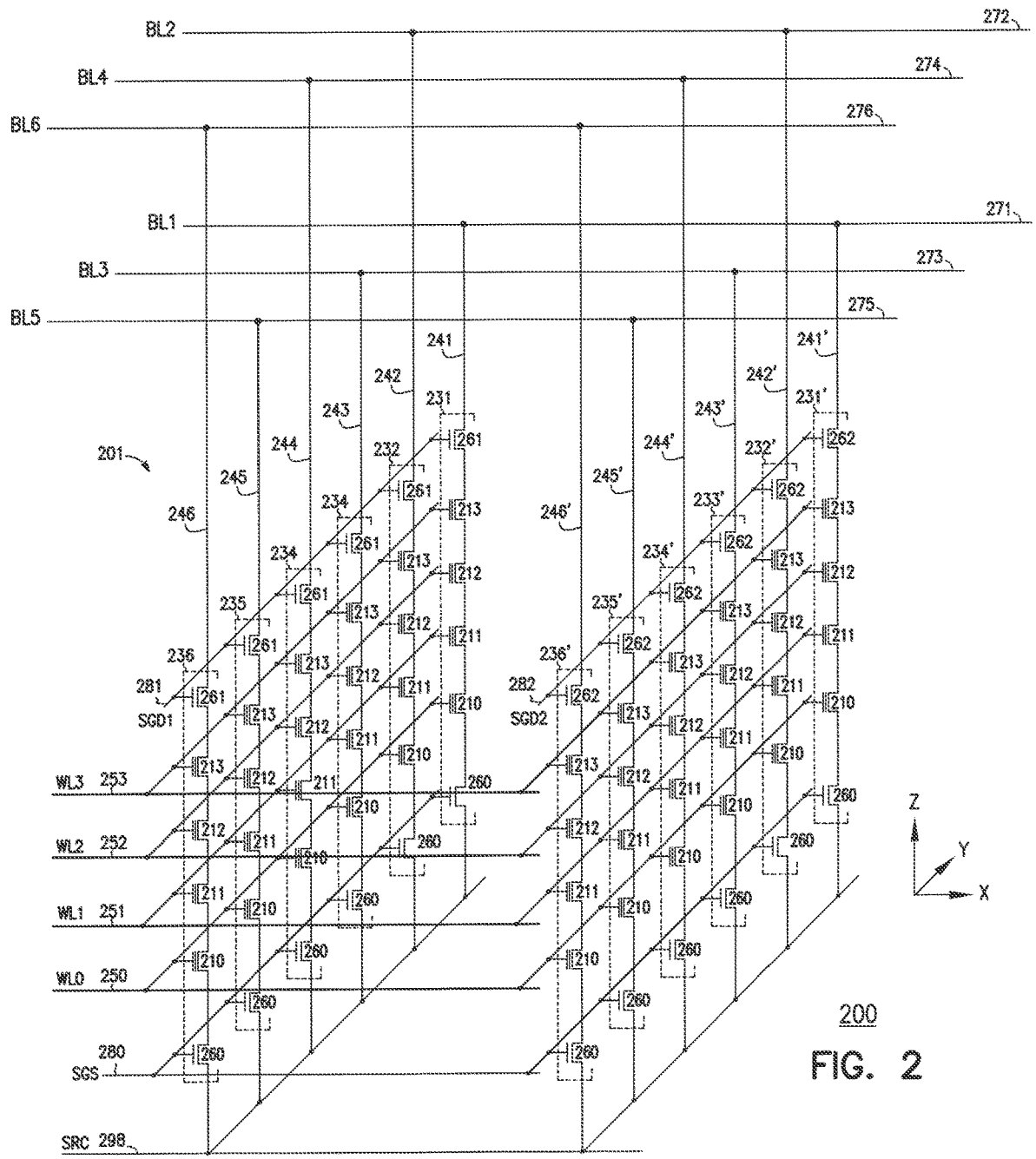
FIG. 2 shows a schematic diagram of a portion of a memory device including a memory array (e.g., memory cell area) and data lines, according to some embodiments described herein.

FIG. 2 shows a schematic diagram of a portion of a memory device 200 including a memory array (e.g., memory cell area) 201 and data lines 271, 272, 273, 274, 275, and 276 (271-276), according to some embodiments described herein. Memory device 200 can correspond to memory device 200 of FIG. 2. For example, memory array 201 can correspond to memory array 101 of FIG. 1. Data lines 271-276 can correspond to data lines 170 of FIG. 1. In another example, memory device 200 can include a control unit (not shown) that can correspond to control unit 118 of FIG. 1. The control unit of memory device 200 can be configured to allow memory device 200 to perform read, write, and erase operations, and other operations of memory device 200.

FIG. 2 shows directions X, Y, and Z that can be relative to the physical directions (e.g., dimensions) of the structure of memory device 200. For example, the Z-direction can be a direction perpendicular to (e.g., vertical direction relative to) a substrate (e.g., a semiconductor substrate) of memory device 200. The Z-direction is perpendicular to the X-direction and Y-direction (e.g., the Z-direction is perpendicular to an X-Y plane of memory device 200).

As shown in FIG. 2, data lines 271, 272, 273, 274, 275, and 276 can carry signals (e.g., bit line signals) BL1, BL2, BL3, BL4, BL5, and BL6, respectively. In the physical structure of memory device 200, data lines 271-276 can be structured as conductive lines and have respective lengths extending in the Y-direction. As described in more detail below, the data lines (e.g., data lines 271-276) of memory device 200 can be formed on different levels (e.g., layers) in the physical structure of memory device 200. For example, data lines 271, 273, and 275 can be formed on one level (e.g., a lower level) of memory device 200, and data lines 272, 274, and 276 can be formed on another level (e.g., an upper level) of memory device 200. FIG. 2 shows memory device 200 including an example of six data lines (e.g., data lines 271-276). However, memory device 200 can include numerous data lines (e.g., more than six data lines).

As shown in FIG. 2, memory array (e.g., memory cell area) 201 can include memory cells 210, 211, 212, and 213 that can be included in (e.g., can be formed in) respective memory cell strings 231, 232, 233, 234, 235, and 236 (231-236), and memory cell strings 231', 232', 233', 234', 235', and 236' (231'-236') of memory device 200. Memory cell strings 231-236 and 231'-236' can be coupled to data lines 271-276 through conductive connections 241, 242, 243, 244, 245, and 246 (241-246) and 241', 242', 243', 244', 245', and 246' (241'-246'), respectively. FIG. 2 shows twelve memory cell strings of memory device 200 as an example. However, memory device 200 can include numerous memory cell strings (e.g., more than twelve memory cell strings). FIG. 2 shows specific connections between memory cell strings 231-236 and 231'-236' and data lines 271-276 as an example. However, memory cell strings 231-236 and 231'-236' can be coupled to data lines 271-276 in different connections. For example, instead of being coupled to both the lower and upper data lines, memory cell strings 231-236 can be coupled to a group of data lines that are similar to data lines 271, 273, and 275 (e.g., data lines located in a lower physical level of memory device 200), and memory cell strings 231'-236' can be coupled to another group of data lines that are similar to data lines 272, 274, and 276 (e.g., data lines located in an upper physical level of memory device 200).

As shown in FIG. 2, each memory cell string (e.g., memory cell string 231) of memory device 200 can have series-connected memory cells (e.g., four series-connected memory cells) in which the series-connected memory cells can include one of memory cells 210, one of memory cells 211, one of memory cells 212, and one of memory cells 213. In a physical structure of memory device 200, each of memory cell strings 231-236 and 231'-236' can be formed (e.g., formed vertically) in a direction outwardly (e.g., Z-direction) from a substrate of memory device 200. In the physical structure of memory device 200, memory cells 210, 211, 212, and 213 can be formed (e.g., formed vertically) in different levels (e.g., four different layers) in the Z-direction of memory device 200 and under the structures of data lines (e.g., data lines 271-276) of memory device 200. FIG. 2 shows an example of four memory cells in each memory cell string (e.g., memory cells 210, 211, 212 and 213 in memory cell string 231). However, the number of memory cells in each memory cell string of memory device 200 can vary.

As shown in FIG. 2, memory device 200 can include control gates 250, 251, 252, and 253 that can carry corresponding signals (e.g., word line signals) WL0, WL1, WL2, and WL3. Control gates 250, 251, 252, and 253 can include (or can be parts of) access lines (which can include word lines) of memory device 200. Each of control gates 250, 251, 252, and 253 can be part of a structure (e.g., a level) of a conductive material (e.g., a layer of conductive material) located in a single level of memory device 200. Memory device 200 can use signals WL0, WL1, WL2, and WL3 to control access to memory cells 210, 211, 212, and 213, respectively, during a memory operation (e.g., read, write, or erase operation). For example, during a read operation, memory device 200 can use signals WL0, WL1, WL2, and WL3 to control access to memory cells 210, 211, 212, and 213 to read (e.g., sense) information (e.g., previously stored information) from memory cells 210, 211, 212, and 213. In another example, during a write operation, memory device 200 can use signals WL0, WL1, WL2, and WL3 to control access to memory cells 210, 211, 212, and 213 to store information in memory cells 210, 211, 212, and 213.

As shown in FIG. 2, memory cells in different memory cell strings can share the same control gate (e.g., share the same physical control gate). For example, memory cells 210 can share control gate 250, memory cells 211 can share control gate 251, memory cells 212 can share control gate 252, and memory cells 213 can share control gate 253.

FIG. 2 shows four control gates (e.g., control gates 250, 251, 252, and 253) of memory device 200 as an example. The number of control gates of memory device 200 can vary (e.g., can be more than four).

As shown in FIG. 2, memory device 200 can include a line (e.g., a source line or a source plate) 298 that can carry a signal (e.g., a source line signal) SRC. Line 298 can be structured as a conductive line or a conductive plate of memory device 200. Line 298 can be common conductive line (e.g., a common source line or a common source plate). Line 298 can be coupled to a ground connection of memory device 200.

Memory device 200 can include select gates (e.g., drain select gates) 281 and 282. Select gates 281 and 282 can carry signals (e.g., drain select gate signals) SGD1 and SGD2, respectively. Select gates 281 and 282 are electrically separated from each other. Select gate 281 can be coupled to memory cell strings 231-236. Select gate 282 can be coupled to memory cell strings 231'-236'.

Memory device 200 can include transistors (e.g., drain select transistors) 261 and 262. Each of memory cell strings 231-236 can include one of transistors 261. Each of memory cell strings 231'-236' can include one of transistors 262. Transistors 261 can share (e.g., can be coupled to) the same select gate 281. Transistors 262 can share (e.g., can be coupled to) the same select gate 282.

Transistors 261 and 262 can be controlled (e.g., turned on or turned off) by signals SGD1 and SGD2, respectively. During a memory operation (e.g., a read or write operation), transistors 261 and transistors 262 can be turned on one at a time (e.g., by activating signals SGD1 and SGD2 one at a time). For example, transistors 261 can be turned on (e.g., by activating signal SGD1) during a memory operation (e.g., a read or write operation) of memory device 200 to couple memory cell strings 231-236 to data lines 271-276, respectively. Transistors 261 can be turned off (e.g., by deactivating signals SGD1) to decouple the memory cell strings 231-236 from data lines 271-276. In another example, transistors 262 can be turned on (e.g., by activating signal SGD2) during a memory operation (e.g., a read or write operation) of memory device 200 to couple the memory cell strings 231'-236' to data lines 271-276, respectively. Transistors 262 can be turned off (e.g., by deactivating signals SGD2) to decouple the memory cell strings 231'-236' from data lines 271-276.

Memory device 200 can include a select gate (e.g., source select gates) 280. Select gate 280 can carry a signal (e.g., source select gate signal) SGS. Select gate 280 can be coupled to memory cell strings 231-236 and 231'-236'.

Memory device 200 can include transistors (e.g., source select transistors) 260. Each of memory cell strings 231-236 and 231'-236' can include one of transistors 262. Transistors 260 can share (e.g., can be coupled to) the same select gate 280. Transistors 260 can be controlled (e.g., turned on or turned off) by the same signal, such as SGS signal. During a memory operation (e.g., a read or write operation) of memory device 200, transistors 260 can be turned on (e.g., by activating SGS signal) to couple memory cell strings 231-236 and 231'-236' to line 298. Transistors 260 can be turned off (e.g., by deactivating SGS signal) to decouple the memory cell strings 231-236 and 231'-236' from line 298.

Memory device 200 includes other components, which are not shown in FIG. 2 so as not to obscure the example embodiments described herein. Some of the structure of memory device 200 is described below with reference to FIG. 3 through FIG. 7C.

Figure 3:
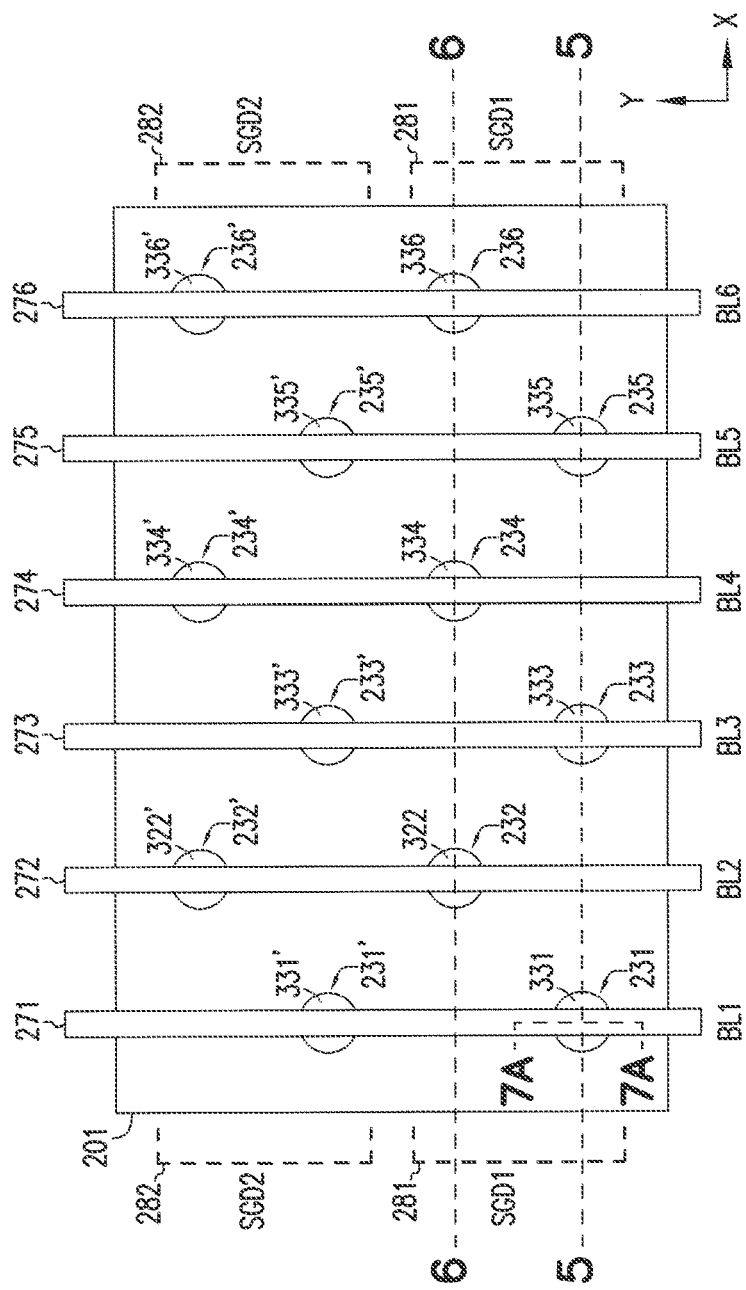
FIG. 3 shows a top view of the structure of the memory device of FIG. 2, according to some embodiments described herein.

FIG. 3 shows a top view of the structure of memory device 200 of FIG. 2 including locations of memory cell strings 231-236 and 231'-236' and data lines 271-276, according to some embodiments described herein. For simplicity, some elements of the structure of memory device 200 may be omitted from a particular figure of the drawings so as not to obscure the description of the element (or elements) being described in that particular figure. For example, dielectric materials (e.g., silicon dioxides) between elements of memory device 200 are omitted from FIG. 3 through FIG. 14. Further, cross-sectional lines (e.g., hatch lines) are omitted from some of the elements shown in the described figures. The dimensions (e.g., physical structure) of the elements shown in the drawings described herein are not scaled.

FIG. 3 shows example locations (from top view) of memory cell strings 231-236 and 231'-236'. However, the locations of memory cell strings 231-236 and 231'-236' can be different from the locations shown in FIG. 3. Different views (e.g., side views) of memory device 200 along line 5-5, line 6-6, and line 7A-7A in FIG. 3 are shown and described below with reference to in FIG. 5, FIG. 6, and FIG. 7A, respectively.

As shown in FIG. 3, memory device 200 can include conductive contacts 331, 332, 333, 334, 335, and 336 (331-336) and 33'1, 332', 333', 334', 335', and 336' (331'-336') coupled to pillars (described below) of respective memory cell strings 231-236 and 231'-236'. Memory device 200 can include conductive structures (shown in FIG. 4) formed under respective data lines 271-276 and over respective conductive contacts 331-336 and 331'-336'.

As shown in FIG. 3, data lines 271-276 can have respective lengths extending in the Y-direction and can be located (e.g., formed) over memory array 201. Each of data lines 271-276 can be located over (e.g., directly over) respective conductive structures (shown in FIG. 4, FIG. 5, and FIG. 6) and over respective conductive contacts among conductive contacts 331-336 and 331'-336'. For example, data line 271 can be located over (e.g., directly over) conductive contacts 331 and 331'. In another example, data line 272 can be located over (e.g., directly over) conductive contacts 332 and 332'.

FIG. 3 also shows outlines of select gates (e.g., drain select gates) 281 and 282. As described above, select gates 281 and 282 are electrically separated from each other. Each of select gates 281 and 282 can have a length in the X-direction. Select gate 281 can be shared by memory cell strings 231-236. For example, select gate 281 spans over portions of memory cell strings 231-236. Select gate 281 can be shared by memory cell strings 231'-236'. For example, select gate 282 spans over portions of memory cell strings 231'-236'.

Figure 4:
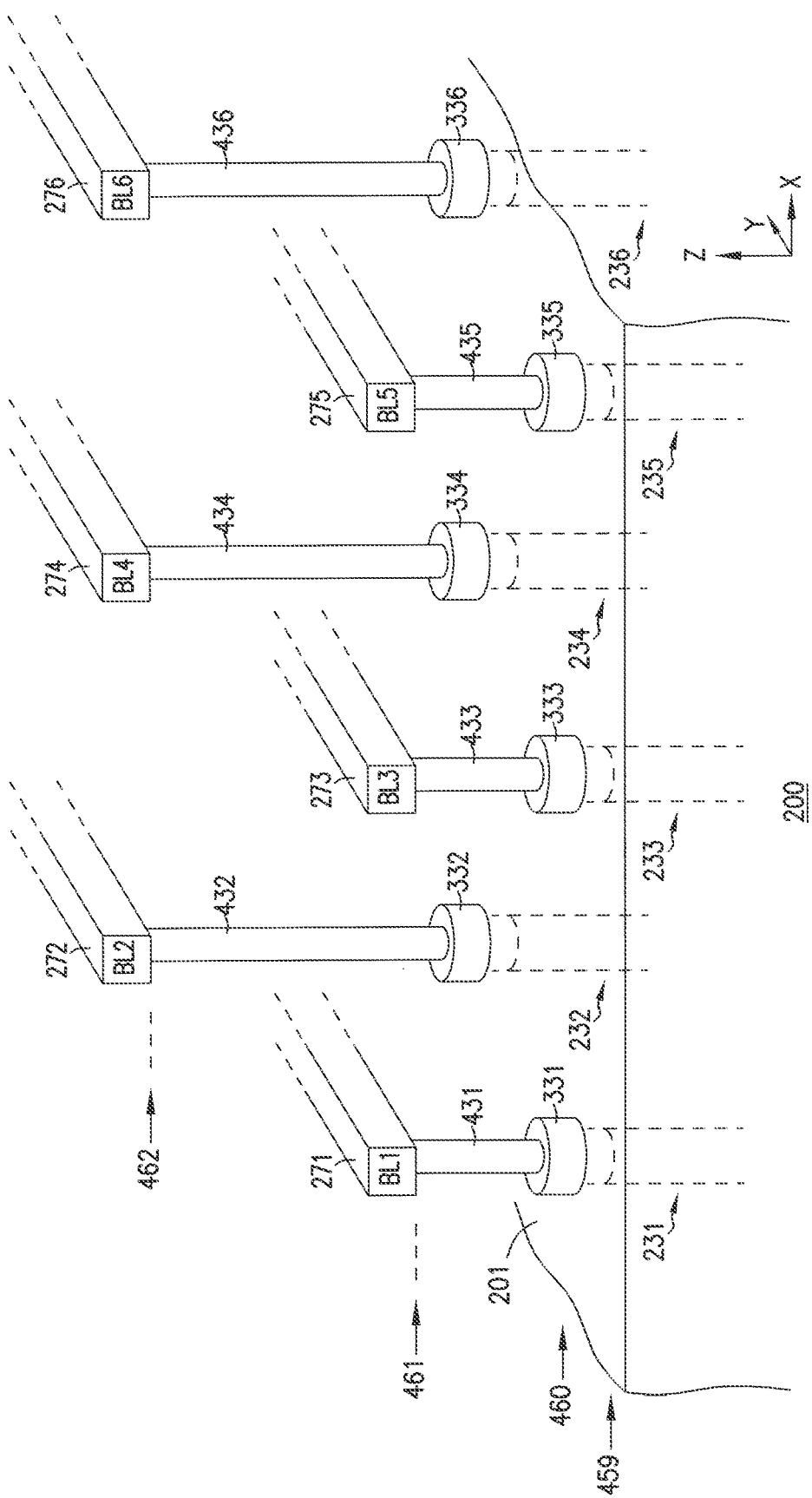
FIG. 4 shows an isometric view (e.g., perspective view) of a portion of the structure memory device of FIG. 3 including data lines located on (e.g., formed on) in multiple levels of memory device, according to some embodiments described herein.

FIG. 4 shows an isometric view (e.g., perspective view) of a portion of the structure memory device 200 of FIG. 3 including data lines located on (e.g., formed on) multiple levels 461 and 462 of memory device 200, according to some embodiments described herein. As shown in FIG. 4, memory device 200 can include different levels (e.g., physical layers) 459, 460, 461, and 462 in the Z-direction. The substrate (not shown) of memory device 200 is located under level 459. As shown in FIG. 4, data lines 271, 273, and 275 can be located on (e.g., formed on) level 461 (e.g., located on the same level). Data lines 272, 274, and 276 can be located on (e.g., formed on) on level 462.

Data lines 271-276 can be located side-by-side in the X-direction, such that adjacent data lines (two data lines immediately located next to each other) among data lines 271-276 can be separated from each other by a distance (e.g., a gap) in the X-direction. Thus, data line on the same level (e.g., level 461 or level 462) can be separated from each other by a distance (e.g., a gap) in the X-direction. For example, data lines 271, 273, and 275 can be located side-by-side in the X-direction, such that data lines 271, 273, and 275 can be separated from each other by a distance (e.g., a gap) in the X-direction. In another example, data lines 272, 274, and 276 can be located side-by-side in the X-direction, such that data lines 272, 274, and 276 can be separated from each other by a distance (e.g., a gap) in the X-direction. The distance in the X-direction between two adjacent data lines (e.g., data lines 271 and 273) one level (e.g., level 461) and the distance in the X-direction between two adjacent data lines (e.g., data lines 272 and 274) on another level (e.g., level 462) can be the same (e.g., equal distance) or can be different (e.g., unequal distances).

For simplicity, only some of conductive contacts (e.g., conductive contacts 331-336) among conductive contacts 331-336 and 331'-336' in FIG. 3 are shown in FIG. 4. Conductive contacts 331-336 can be located at (e.g., formed on) respective locations and on the same level (e.g., level 460) of memory device 200. FIG. 4 shows specific shapes (e.g., cylindrical shapes) of conductive contacts 331-336 as an example. However, conductive contacts 331-336 and 331'-336' (FIG. 3 and FIG. 4) can have different shapes (e.g., square box shapes, rectangular box shapes, or other shapes).

Only some of memory cell strings (e.g., memory cell strings 231-236) among the memory cells strings 231-236 and 231'-236' of FIG. 3 are shown in FIG. 4. Memory cell strings 231-236 can be located at (e.g., formed on) respective locations of memory array 201. For simplicity, details of memory cell strings 231-236 are omitted from FIG. 4. Memory cell strings 231-236 can include pillars (in dashed lines and not labeled) that have pillar contacts (in dashed lines and not labeled) located on level 459. The pillar contacts are located under respective conductive contacts 331-336 and can be coupled to (in electrical contact with) respective conductive contacts 331-336.

As shown in FIG. 4, memory device 200 can include conductive structures (e.g., vertical conductive structures) 431, 432, 433, 434, 435, and 436 (431-436) coupled to data lines 271-276, respectively, and to conductive contacts 331-336, respectively. For simplicity, other conductive structures (e.g., conductive structures between data lines 271-276 and respective conductive contacts 331'-336' in FIG. 3) are not shown in FIG. 4.

In FIG. 4, each of conductive structures 431-436 can include a length extending in the Z-direction. The length of each of conductive structures 431, 433, and 435 can be less than the length of each of conductive structures 432, 434, and 436. Each of conductive structures 431-436 can include (e.g., can be formed from) a conductive material that extends in the Z-direction. Examples of the conductive material include metal, conductively doped polysilicon, or other conductive materials. Although not shown in FIG. 4, memory device 200 can include a dielectric material (e.g., silicon dioxide) formed between levels 459 and 462. The dielectric material can be formed before conductive structures 431-436. Then, openings (e.g., holes (e.g., vertical vias)) can be formed in the dielectric material. The material of each of conductive structures 431-436 can be formed (e.g., deposited) inside a respective opening of the openings.

As shown in FIG. 4, each of conductive structures 431-436 can be coupled to (e.g., in electrical contact with) a respective conductive contact among conductive contacts 331-336 and coupled to (e.g., in electrical contact with) a respective data line among data lines 271-276. For example, conductive structure 431 can include an end (e.g., bottom end) coupled to (e.g., directly contacting) conductive contact 331, and another end (e.g., top end) coupled to (e.g., directly contacting) data line 271. In another example, conductive structure 432 can include an end (e.g., bottom end) coupled to (e.g., directly contacting) conductive contact 332, and another end (e.g., top end) coupled to (e.g., directly contacting) data line 272. FIG. 4 omits other conductive structures between respective data lines 271-276 and other conductive contacts (e.g., conductive contacts 331'-336' shown in FIG. 3) of memory device 200.

In FIG. 4, conductive structure 431 and conductive contact 331 can be part of conductive connection 241 (FIG. 2). Similarly, conductive structure 432 and conductive contact 332 can be part of conductive connection 242 (FIG. 2). Conductive structure 433 and conductive contact 333 can be part of conductive connection 243 (FIG. 2). Conductive structure 434 and conductive contact 334 can be part of conductive connection 244 (FIG. 2). Conductive structure 435 and conductive contact 335 can be part of conductive connection 245 (FIG. 2). Conductive structure 436 and conductive contact 336 can be part of conductive connection 246 (FIG. 2).

FIG. 5 shows a side view (e.g., cross-sectional view) of the structure of memory device 200 of FIG. 2 along line 5-5 of FIG. 3, according to some embodiments described herein. FIG. 6 shows side view (e.g., cross-sectional view) of the structure of memory device 200 of FIG. 2 along line 6-6 of FIG. 3, according to some embodiments described herein. As shown in FIG. 5 and FIG. 6, data lines 271, 273, and 275 can be located on (e.g., formed on) level 461 of memory device 200. Data lines 272, 274, and 276 can be located on (e.g., formed on) another level (e.g., level 462) of memory device 200.

As shown in FIG. 5 and FIG. 6, memory cell strings 231-236 can include pillars (e.g., vertical pillars) 541, 542, 543, 544, 545, and 546 (541-546), respectively. Pillars 541-546 can include pillar contacts 541C-546C, respectively, located on the same level (e.g., level 459) of memory device 200. Pillars 541-546 can be located under (e.g., directly under) respective conductive contacts 331-336 and under (e.g., directly under) respective conductive structures 431-436.

Conductive structures 431-436 can be coupled to (e.g., in electrical contact with) pillars 541-546, respectively, through conductive contacts 331-336 of pillars 541-546, respectively. Thus, as shown in FIG. 5 and FIG. 6, data lines 271-276 can be coupled to (e.g., electrically coupled to) pillars 541-546, respectively, through respective conductive structures 431-436 and respective conductive contacts 331-336.

As shown in FIG. 3 through FIG. 6, memory cell strings 231, 233, 235, 231', 233', and 235' can include different rows of pillars coupled to data lines 271, 273, and 275. For example, memory cell strings 231, 233, and 235 (FIG. 4 and FIG. 5) can include a row of pillars 541, 543, and 545 (in the X-direction) coupled to data lines 271, 273, and 275. Memory cell strings 232, 234, 236, 232', 234', and 236' can include different rows of pillars coupled to data lines 272, 274, and 276. For example, memory cell strings 232, 234, and 236 (FIG. 4 and FIG. 5) can include a row of pillars 542, 544, and 546 (in the X-direction, next to row of pillars 541, 543, and 545) coupled to data lines 272, 274, and 276.

As shown in FIG. 5 and FIG. 6, the distance (e.g., vertical distance) between data lines 271, 273, and 275 and respective pillar contacts 541C, 543C, and 545C can be less than the distance (e.g., vertical distance) between lines 272, 274, and 276 and respective pillar contacts 542C, 544C, and 546C.

In an alternative structure of memory device 200, the conductive contacts (e.g., conductive contacts 331-336) of memory device 200 can be omitted. Thus, in the alternative structure of memory device 200, conductive structures 431-436 can be directly coupled to (e.g., in direct electrical contact with) pillars 541-546, respectively.

FIG. 7A shows a side view (e.g., a cross section with respect to the X-Z directions) of a portion of the structure of memory device 200 of FIG. 2 and FIG. 3 including a structure of memory cell string 231 having pillar 541, according to some embodiments described herein. FIG. 7A shows the structure of one memory cell string (e.g., memory cell string 231) of memory device 200. However, other memory cell strings (e.g., memory cell strings 232-236 and 231'-236' in FIG. 2) of memory device 200 can have a similar or the same structure as memory cell string 231 shown in FIG. 7A.

In FIG. 7A, data lines 271 and 272, conductive structures 431 and 432, conductive contacts 331 and 332, and pillars 541 and 542 are the same as those shown in FIG. 4, FIG. 5, and FIG. 6. As shown in FIG. 7A, each of data lines 271 and 272 can have a thickness in the Z-direction and a width in the X-direction. Each of the thickness (in the Z-direction) and the width (in the X-direction) is less than the length (in the Y-direction). The thickness can be less than, equal to, or greater than the width.

As shown in FIG. 7, data lines 271 and 272 are located in levels 461 and 462, respectively. Levels 461 and 462 are in a portion of memory device 200 that is over memory array 201 with respect to the Z-direction. Memory array 201 is located over a substrate 790 of memory device 200. As described above with reference to FIG. 2, memory array 201 is where the memory cell strings (one of which is shown as memory cell string 231) of memory device 200 can be formed.

As shown in FIG. 7A, pillar (e.g., a vertical pillar) 541 can be part of memory cell string 231 and can have a length extending in the Z-direction (e.g., extend vertically with respect to substrate 790). Pillar 541 can extend through memory cells 210, 211, 212, and 213 of memory cell string 231. Pillar 541 can include (e.g., can be formed from) a conductive material (e.g., conductively doped polysilicon). Each of memory cells 210, 211, 212, and 213 can include a structure of transistor (e.g., a memory cell transistor). Part of pillar 541 can form the channel region (e.g., to conduct current) of the transistor of each memory cells 210, 211, 212, and 213.

Pillar contact 541C can be formed from conductively doped polysilicon, metal, or other conductive materials. Pillar 541 can include a portion 744. Pillar contact 541C and portion 744 of pillar 541 can include the same conductive material or different conductive materials.

Conductive structure 431, conductive contact 331, and pillar 541 can be part of a circuit path (e.g., a conductive channel of memory cell string 231) between data line 271 and a conductive region 798 (associated with signal SRC). Conductive region 798 can be part of line (e.g., source line or source plate) 298 in FIG. 2. Conductive structure 431 and pillar 541 can have the same material or different materials.

Conductive structure 431 and pillar 541 can have the same diameter or different diameters. In FIG. 7A, during a memory operation (e.g., read or write operation) of memory device 200, a circuit path (e.g., a current path) can be formed between data line 271 and conductive region 798 through conductive structure 431, conductive contact 331, and pillar 541 (which includes pillar contact 541C and portion 744 of pillar 541).

Substrate 790 of memory device 200 can include a semiconductor substrate (e.g., silicon-based substrate). For example, substrate 790 can include a p-type silicon substrate or an n-type silicon substrate. As shown in FIG. 7A, memory cells 210, 211, 212, and 213 of memory cell string 231 can be located along (e.g., adjacent) respective portions of pillar 541 in different levels (in the Z-direction) of memory device 200. For example, memory cells 210, 211, 212, and 213 can be located one over another (e.g., formed vertically) in levels 750, 751, 752, and 753, respectively, of memory device 200. Memory cells 210, 211, 212, and 213 of other memory cell strings (e.g., memory cell strings 232-236 and 231'-236' in FIG. 2) of memory device 200 can also be located on respective levels 750, 751, 752, and 753, as memory cells 210, 211, 212, and 213 (FIG. 7A) of memory cell string 231.

Control gates 250, 251, 252, and 253 memory device 200 can be located along (e.g., adjacent) respective portions (in the Z-direction) of pillar 541 in the same levels (e.g., levels 750, 751, 752, and 753, respectively) that memory cells 210, 211, 212, and 213 are located. Control gates 250, 251, 252, and 253 can include (e.g., can be formed form) a conductive material (or materials). Example materials for control gates 250, 251, 252, and 253 include metal, doped polysilicon, other conductive materials.

In FIG. 7A, select gate (e.g., drain select gate) 281 can have a length extending in the X-direction (e.g., perpendicular to the lengths (in the Y-direction) of data lines 271 and 272). The materials of select gate 281 can include a conductive material (e.g., conductively doped polysilicon, metal, other conductive material).

FIG. 7A shows an example where select gate (e.g., source select gate) 280 can have a structure (e.g., shape, material, or both) similar to (or the same as) that of select gate 281. However, select gate 280 can have a structure (e.g., shape, material, or both) similar to (or the same as) that of each of control gates 250, 251, 252, and 253.

As shown in FIG. 7A, transistor (e.g., source select transistor) 260 and transistor (e.g., drain select transistor) 261 can be located along (e.g., adjacent) respective portions of pillar 541 in the Z-direction. Memory cells 210, 211, 212, and 213 of memory cell string 231 can be located along the portion of pillar 541 that is between transistors 260 and 261.

Memory cell string 231 can include materials 703, 704, 705 formed between portion 744 of pillar 541 and a respective control gate among control gates 250, 251, 252, and 253. Material 703 can also be formed between pillar 541 and each of select gates 280 and 281. Materials 703, 704, and 705 located at a particular memory cell (among memory cells 210, 211, 212, and 213) can be part (e.g., a memory element) of that particular memory cell. As shown in FIG. 7A, the combination of materials 703, 704, and 705 of a memory cell (among memory cells 210, 211, 212, and 213) can be separated from (in the Z-direction) the combination of materials 703, 704, and 705 of another memory cell (among memory cells 210, 211, 212, and 213).

Material 703 can include a charge blocking material (or charge blocking materials), for example, a dielectric material (e.g., silicon nitride) that is capable of blocking a tunneling of a charge.

Material 704 can include a charge storage material (or charge storage materials) that can provide a charge storage function to represent a value of information stored in memory cells 210, 211, 212, and 213. For example, material 704 can include polysilicon (e.g., conductively doped polysilicon), which can be either a p-type polysilicon or an n-type polysilicon. The polysilicon can be configured to operate as a floating gate (e.g., to store charge) in a memory cell (e.g., a memory cell 210, 211, 212, or 213). In another example, material 704 can include a dielectric material (e.g., silicon-nitride based material or other dielectric materials) that can trap charge in a memory cell (e.g., a memory cell 210, 211, 212, or 213).

Material 705 can include a tunnel dielectric material (or tunnel dielectric materials), for example, silicon dioxide, that is capable of allowing tunneling of a charge (e.g., electrons).

As shown in FIG. 7A, memory device 200 can include circuitry 795 located (e.g., formed) under memory array 201 (e.g., located directly under memory cell string 231). Circuitry 795 can include circuit elements (e.g., transistors T) coupled to other circuit elements (e.g., coupled to data lines 271-276) of memory device 200. The circuit elements (e.g., transistors T) of circuitry 795 can be configured to perform part of a function of a memory device (e.g., memory device 200). For example, circuitry 795 can include decoder circuits, driver circuits, buffers (e.g., page buffers), sense amplifiers, charge pumps, and other circuitry of memory device 200. In an alternative structure of memory device 200, circuitry 795 can be located (e.g., formed) over memory array 201 (instead of under memory array 201). For example, in the alternative structure of memory device 200, circuitry 795 can be located over memory array 201 and under data lines 271 and 272 (e.g., circuitry 795 is located between data lines 271 and 272 memory array 201 in the Z-direction). In another example, in the alternative structure of memory device 200, circuitry 795 can be located over memory array 201 and over data lines 271 and 272 (e.g., data lines 271 and 272 are located between circuitry 795 and memory array 201 in the Z-direction).

Different views of pillar 541 along lines 7B-7B and 7C-7C are shown in FIG. 7B and FIG. 7C, respectively. FIG. 7B shows a top view (e.g., a cross section with respect to the X-Y plan) of portion 744 of pillar 541 along line 7B-7B of FIG. 7A. FIG. 7C shows a top view (e.g., a cross section with respect to the X-Y plan) of pillar contact 740 of pillar 541 along line 7C-7C of FIG. 7A.

As shown in FIG. 7B, portion 744 can include material 744A and material 744B surrounded by material 744A. Material 744A can be (or can include) part of a conductive structure (e.g., a conductive channel) of pillar 541. Material 744B can include a dielectric material. In an alternative structure of pillar 541, material 744B can be omitted from pillar 541, such that the entire portion 744 of pillar 541 can include material 744A (without material 744B).

As shown in FIG. 7C, the shape of pillar contact 740 (e.g., from a top view) can be relatively circular. Similarly, in FIG. 7C, the shape of portion 744 (e.g., in a top view) can be relatively circular. Other pillar contacts of other memory cell strings (shown in FIG. 2) of memory device 200 can be have a similar shape as the shape of pillar contact 740.

Figure 8:
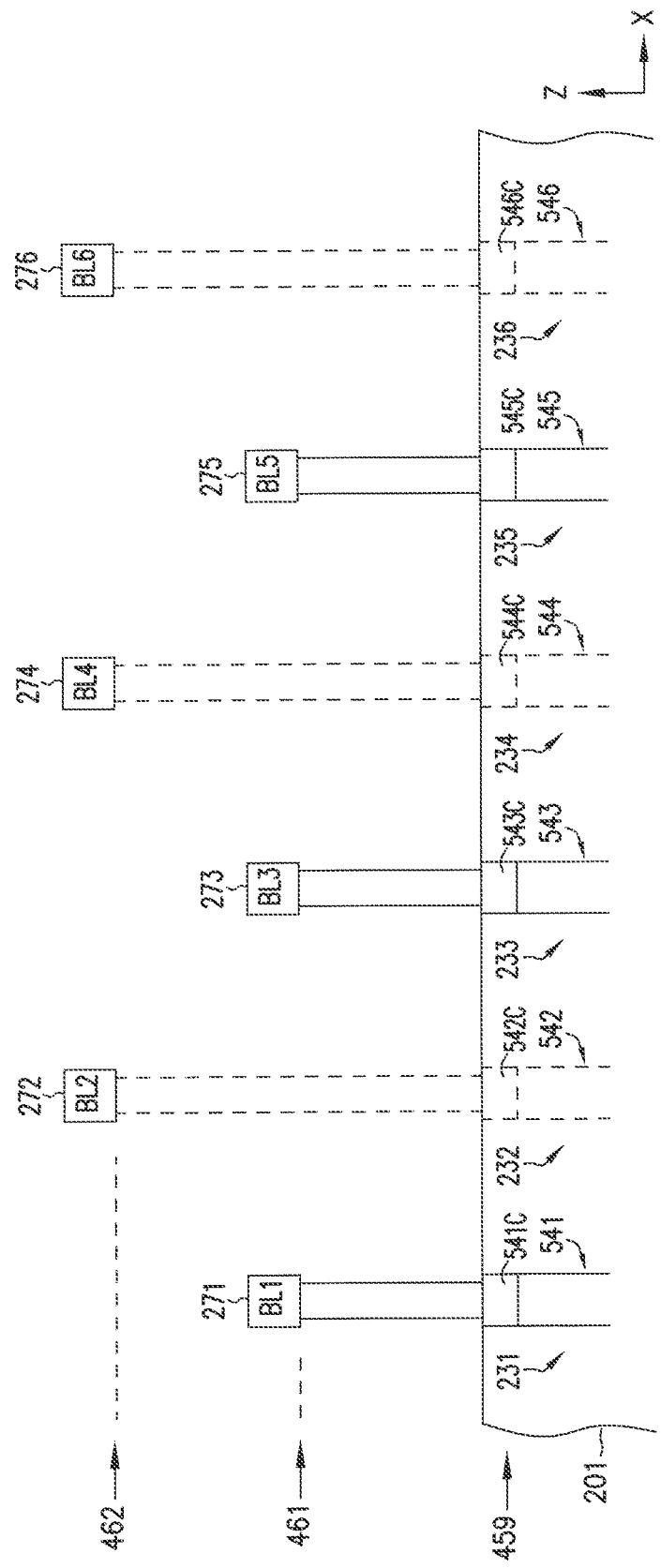
FIG. 8 shows a side view (e.g., cross-sectional view) of a structure of a portion of a memory device that can be a variation of the memory device shown in FIG. 2 through FIG. 7C, according to some embodiments escribed herein.

FIG. 8 shows a side view (e.g., cross-sectional view) of a structure of a portion of a memory device 800 that can be a variation of the memory device 200 shown in FIG. 2 through FIG. 7C, according to some embodiments described herein. Memory device 800 can include elements that are similar to (or the same as) the elements of memory device 200. Thus, for simplicity, similar and the same elements between memory devices 200 and 800 are given the same labels and their description is not repeated.

Differences between memory device 800 (FIG. 8) and memory device 200 (e.g., FIG. 5 and FIG. 6) include the omission of the conductive contacts 331-336 from memory device 800 in FIG. 8. Thus, as shown in FIG. 8, conductive structures 431-436 can be directly coupled to pillar contacts 541C-546C, respectively, of pillars 541-546, respectively.

FIG. 9A shows a side view (e.g., a cross section with respect to the X-Z directions) of another portion of a structure of a memory device 800 of FIG. 8 including a structure of memory cell string 231 and pillar 541, according to some embodiments described herein. Differences between memory device 800 (FIG. 8) and memory device 200 (e.g., FIG. 7A) include the omission of the conductive contacts (e.g., conductive contacts 331 and 332) from memory device 800. Thus, as shown in FIG. 9, conductive structure 431 can be directly coupled to pillar contact 541C. Similarly, conductive structure 432 and other conductive structures (not shown) of memory device 800 can be directly coupled to respective pillar contacts of respective of pillars of memory device 800.

Figure 10:
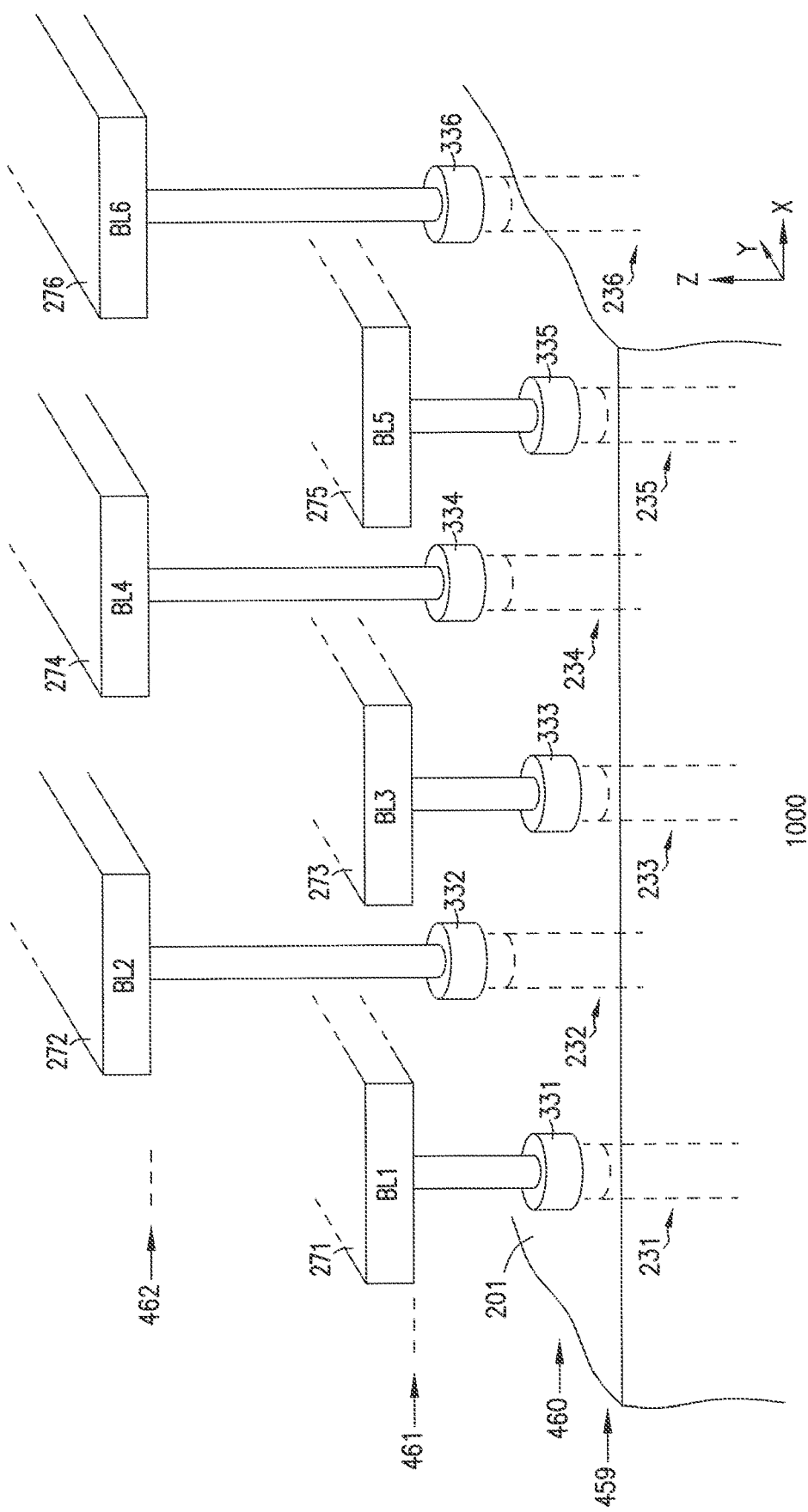
FIG. 10 shows an isometric view (e.g., perspective view) of a portion of the structure a memory device having data lines that can be variations the data lines of the memory device shown in FIG. 2 through FIG. 7C, according to some embodiments described herein.

FIG. 10 shows an isometric view (e.g., perspective view) of a portion of the structure a memory device 1000 having data lines 271-276 that can be a variation of data lines 271-276 of memory device 200 shown in FIG. 2 through FIG. 7C, according to some embodiments described herein. Memory device 1000 can include elements that are similar to (or the same as) the elements of memory device 200. Thus, for simplicity, similar and the same elements between memory devices 200 and 1000 are given the same labels and their description is not repeated. Differences between memory devices 200 and 1000 include the shapes of data lines 271-276 of memory device 1000 in FIG. 10. As shown in FIG. 10, each of data lines 271-276 can include a thickness (in the Z-direction) and a width (in the X-direction) that is greater than the thickness.

Figure 11:
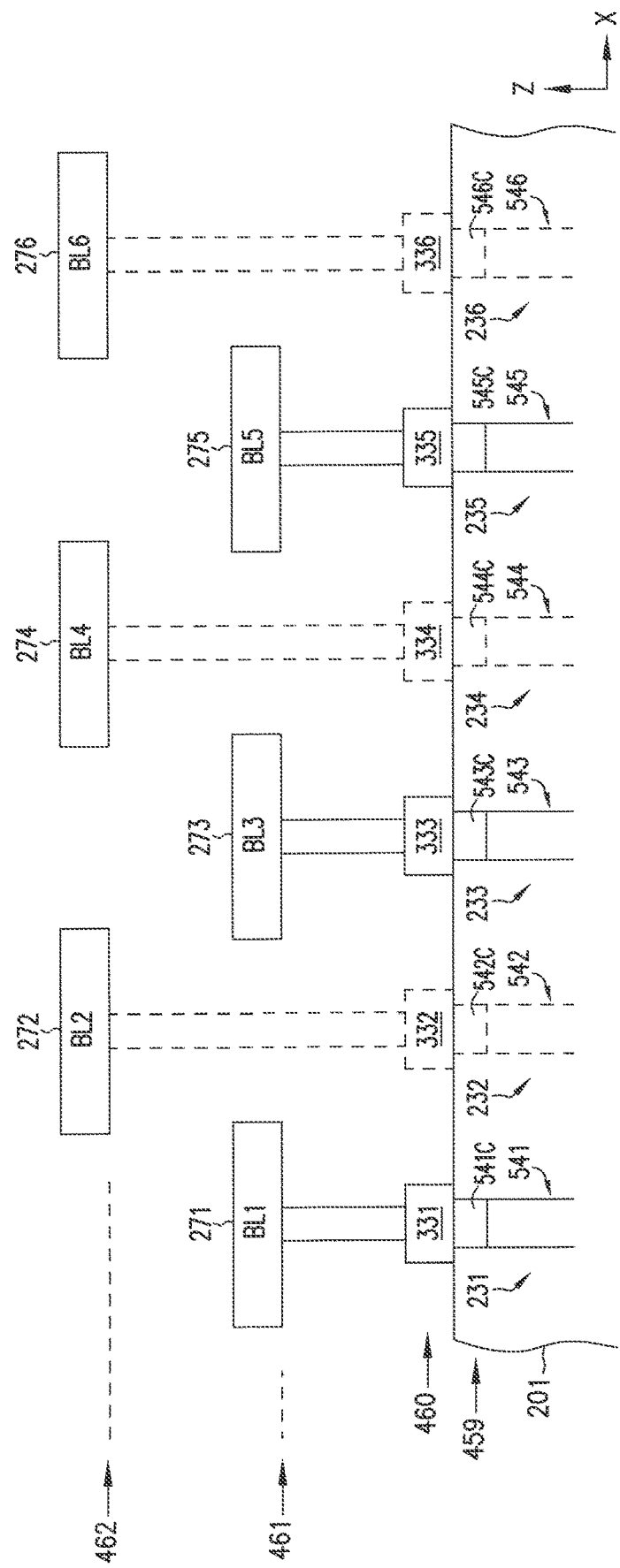
FIG. 11 shows a side view (e.g., cross-sectional view) of a structure of a memory device of FIG. 10, according to some embodiments described herein.

FIG. 11 shows a side view (e.g., cross-sectional view) of the structure of memory device 1000 of FIG. 10, according to some embodiments described herein. FIG. 11 shows an example where data lines 271, 273, and 275 overlap (in the X-direction) data lines 272, 274, and 276. However, in an alternative structure of memory device 1000, data lines 271, 273, and 275 may not overlap (e.g., the X-direction) data lines 272, 274, and 276.

Figure 12:
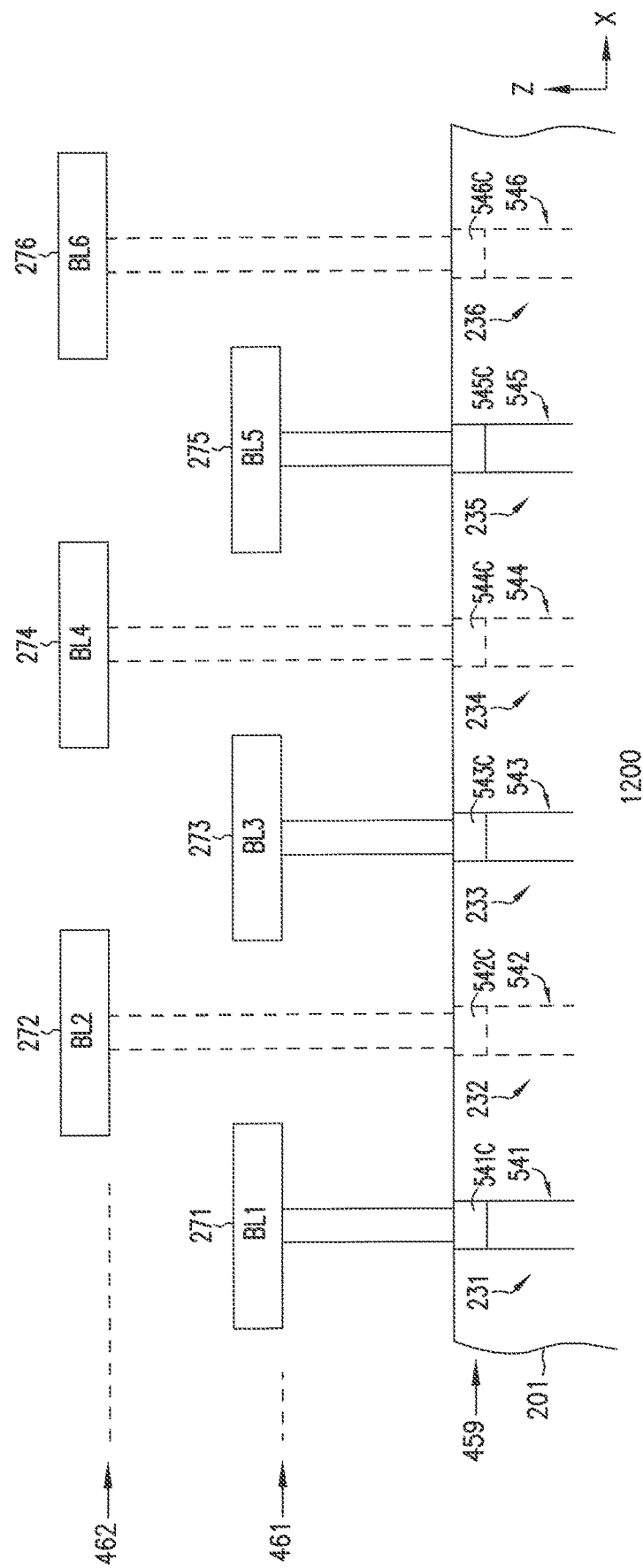
FIG. 12 shows a side view (e.g., cross-sectional view) of a structure of a memory device that can be a variation of the memory device of FIG. 11, according to some embodiments described herein.

FIG. 12 shows a side view (e.g., cross-sectional view) of the structure of a memory device 1200 that can be a variation of memory device 1000 of FIG. 11, according to some embodiments described herein. Differences between memory devices 1000 (FIG. 10) and memory device 1200 include the omission of the conductive contacts 331-336 from memory device 1200 in FIG. 1200. Thus, as shown in FIG. 12, conductive structures 431-436 can be directly coupled to pillar contacts 541C-546C, respectively, of pillars 541-546, respectively, of memory device 1200.

Figure 13:
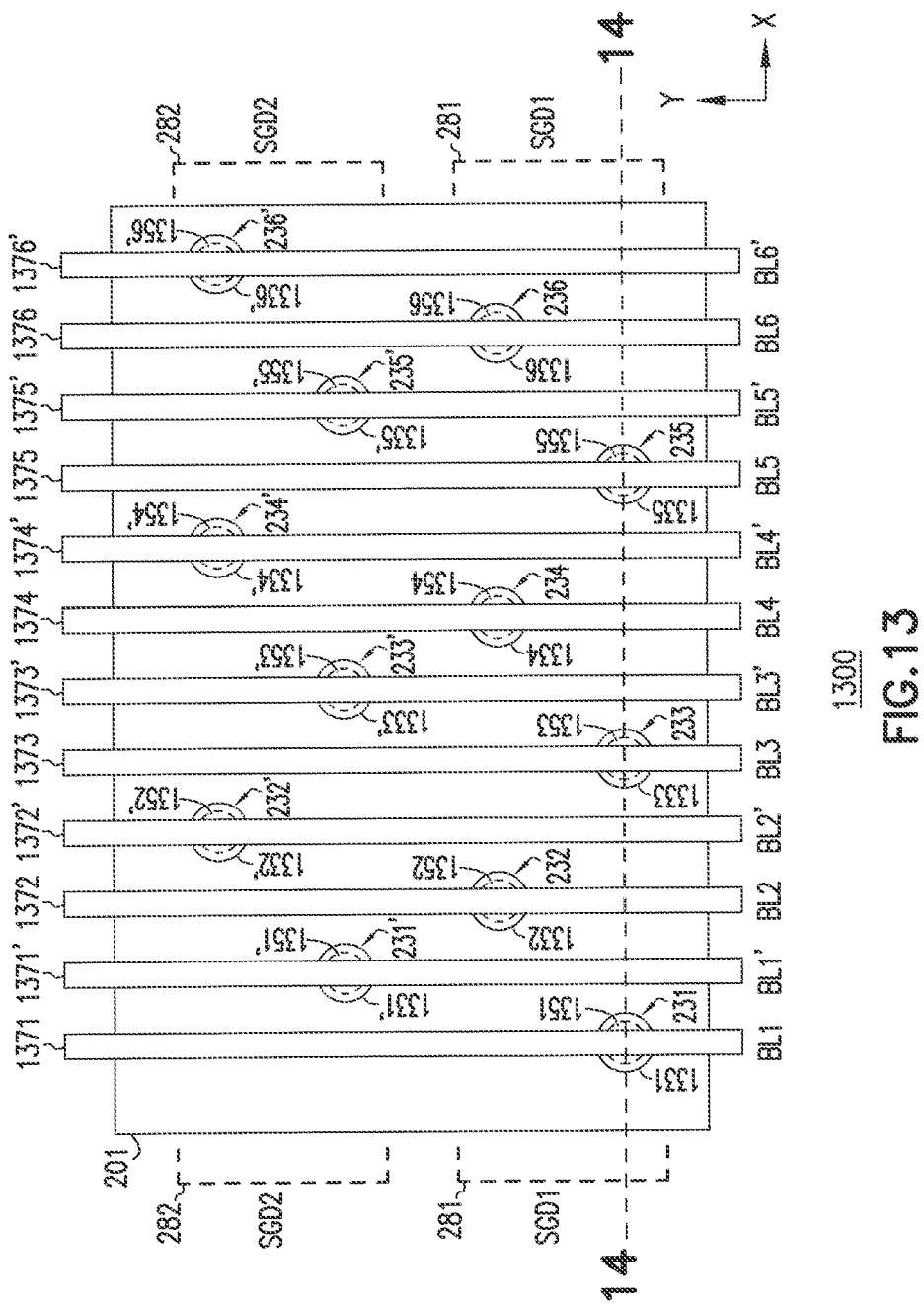
FIG. 13 shows a top view of the structure of a memory device including rows of pillars of memory cell strings and data lines, according to some embodiments described herein.
Figure 14:
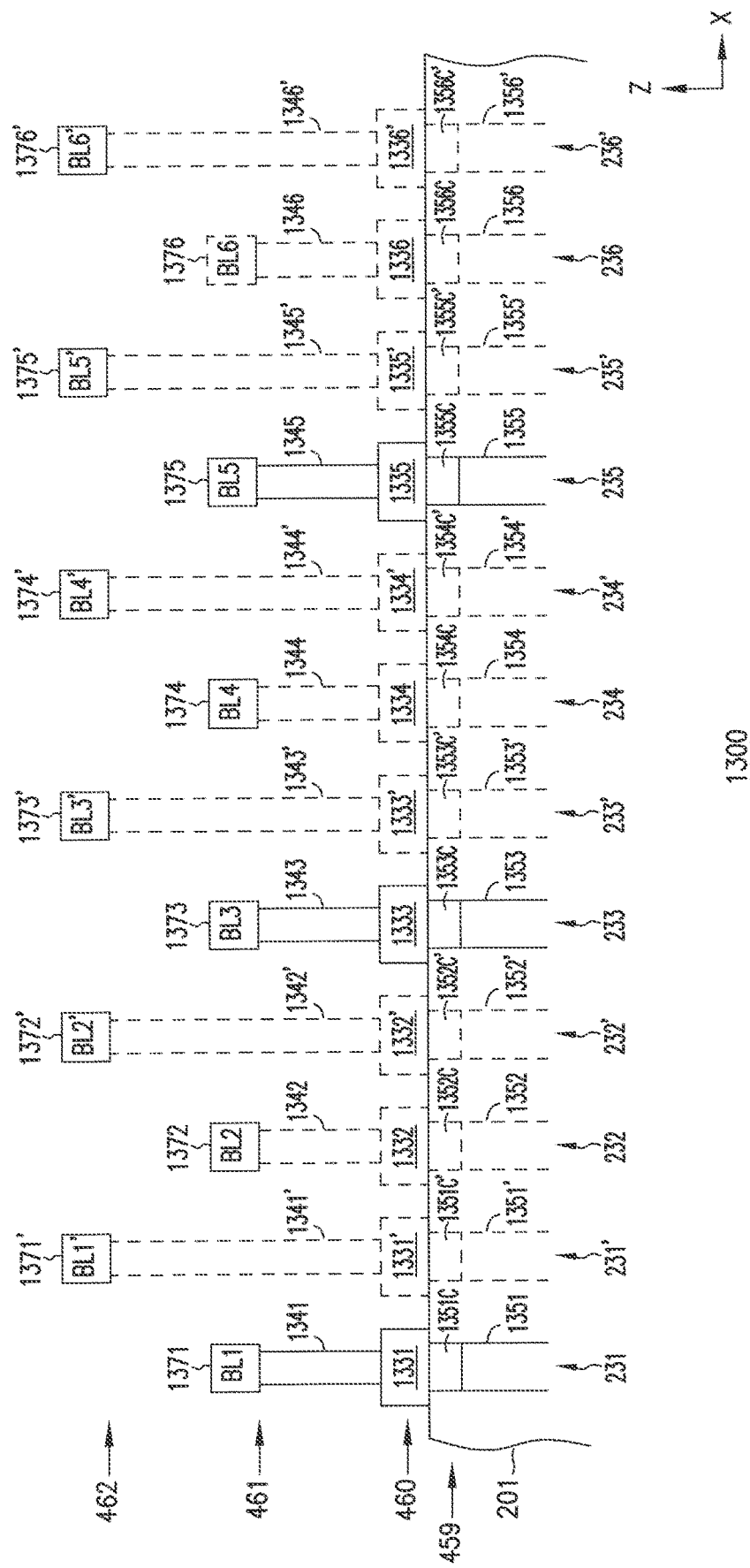
FIG. 14 shows a side view (e.g., cross-sectional views) of the structure of the memory along line 13-13 of FIG. 13, according to some embodiments described herein.

FIG. 13 shows a top view of the structure of a memory device 1300 including rows of pillars of memory cell strings 231-236 and 231'-236' and data lines 271-276 and 1371'-1376', according to some embodiments described herein. FIG. 14 shows a side view (e.g., cross-sectional view) of the structure of memory device 1300 of FIG. 13 along line 14-14 of FIG. 13, according to some embodiments described herein. Memory device 1300 (FIG. 13 and FIG. 14) can be a variation of memory device 200 shown in FIG. 2 through FIG. 7C. Thus, for simplicity, similar and the same elements between memory devices 200 and 1300 are given the same labels and their description is not repeated. Differences between memory devices 200 and 1300 include the formation (e.g., arrangement) of data lines 1371-1376 and 1371'-1376' in FIG. 13 and the formation (e.g., arrangement) of memory cell strings 231-236 and 231'-236'.

As shown in FIG. 13, select gate (e.g., source select gate) 281, which is associated with signal SGD1, can be coupled to memory cell strings 231-236. Select gate (e.g., source select gate) 282, which associated with signal SGD2, can be coupled to memory cell strings 231'-236'.

As shown in FIG. 13 and FIG. 14, data lines 1371-1376 can be located on level 461 of memory device 1300. Data lines 1371-1376 can carry signals (e.g., bit line signals) BL1, BL2, BL3, BL4, BL5, and BL6, respectively. Data lines 1371'-1376' can be located on level 462 (which is above level 461) of memory device 1300. Data lines 1371'-1376' can carry signals (e.g., bit line signals) BL1', BL2', BL3', BL4', BL5', and BL6', respectively.

Data lines 1371-1376 can include a group of data lines 1371, 1373, and 1375, and a group of data lines 1372, 1374, and 1376 interleaved with the group of data lines 1371, 1373, and 1375. Memory cell strings 231-236 can include a row of pillars 1351, 1353, and 1355 and a row of pillars 1352, 1354, and 1356 (immediately next to (e.g., adjacent) the row of pillars 1351, 1353, and 1355). The row of pillars 1351, 1353, and 1355 can be coupled to data lines 1371, 1373, and 1375, respectively. The row of pillars 1352, 1354, and 1356 can be coupled to data lines 1372, 1374, and 1376, respectively.

Data lines 1371'-1376' can include a group of data lines 1371', 1373', and 1375', and a group of data lines 1372', 1374', and 1376' interleaved with the group of data lines 1371', 1373', and 1375'. Memory cell strings 231'-236' can include a row of pillars 1351', 1353', and 1355' and a row of pillars 1352', 1354', and 1356' (immediately next to (e.g., adjacent) the row of pillars 1351', 1353', and 1355'). The row of pillars 1351', 1353', and 1355' can be coupled to data lines 1371', 1373', and 1375', respectively. The row of pillars 1352', 1354', and 1356' can be coupled to data lines 1372', 1374', and 1376', respectively.

Memory device 1300 can include conductive structures 1341-1346 and 1341'-1346', and conductive contacts 1331-1336 and 1331'-1336'. Conductive structures 1341-1346 can be coupled to data lines 1371-1376, respectively, and to conductive contacts 1331-1336, respectively. Conductive structures 1341'-1346' can be coupled to data lines 1371'-1376', respectively, and to conductive contacts 1331'-1336', respectively.

Conductive contacts 1331-1336 can be coupled to pillar contacts 1351C-1356C, respectively, of pillars 1351-1356, respectively. Conductive contacts 1331'-1336' can be coupled to pillar contacts 1351C'-1356C', respectively, of pillars 1351'-1356', respectively.

In an alternative structure of memory device 1300, conductive contacts 1331-1336 and 1331'-1336' can be omitted. Thus, in the alternative structure of memory device 1300, conductive structures 1341-1346 can be directly coupled pillar contacts 1351C-1356C, respectively. In the alternative structure of memory device 1300, conductive structures 1341'-1346' can be directly coupled pillar contacts 1351C'-1356C', respectively.

Figure 15:
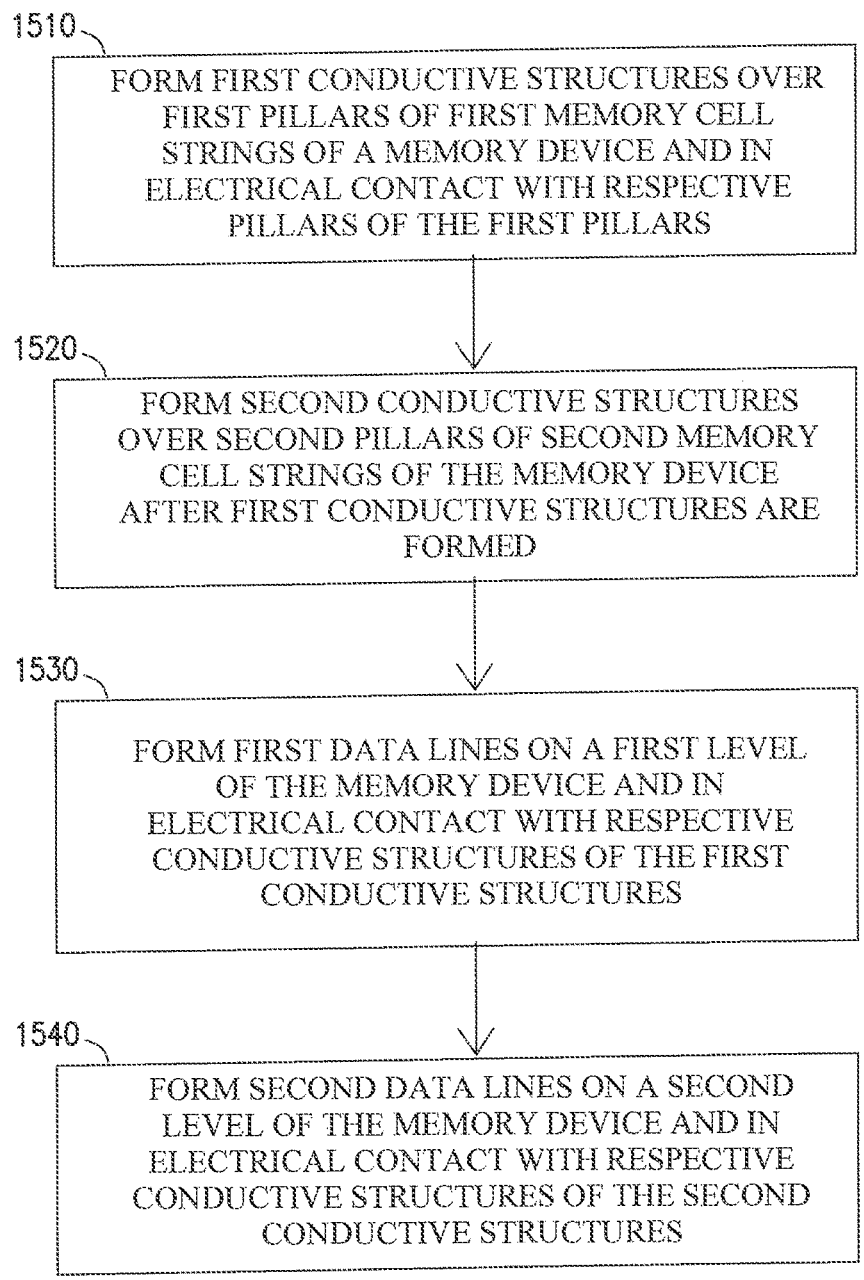
FIG. 15 is a flowchart showing a process of forming data lines in different levels (multiple physical levels) of a memory device, according to some embodiments described herein.

FIG. 15 is a flowchart showing a method 1500 of forming data lines in different levels (multiple physical levels) of a memory device, according to some embodiments described herein. Method 1500 can be used to form at least part of a memory device described herein. For example, method 1500 can be used to form the data lines of memory device 100,

200, 800, 1000, 1200, and 1300. As shown in FIG. 15, method 1500 can include activities 1510, 1520, 1530, and 1540.

Activity 1510 can include forming conductive structures over first pillars of first memory cell strings of a memory device and in electrical contact with respective pillars of the first pillars, the first memory cell strings including memory cells located on different levels of the memory device.

Forming the first conductive structures can include depositing a first conductive material in first holes. The first holes can be formed over respective pillars of the first pillars before the conductive material (which formed conductive structures) is formed.

The conductive structures in activity 1510 can include conductive structures 431, 433, and 435 (FIG. 4 and FIG. 5). The first pillars and the first memory cell strings in activity 1510 can include pillars 541, 543, and 545 (FIG. 5) of memory cell strings 231, 233, and 235, respectively. Alternatively, the conductive structures in activity 1510 can include conductive structures 1341-1346 (FIG. 13). The first pillars and the first memory cell strings in activity 1510 can alternatively include pillars 1351-1356 (FIG. 14) of memory cell strings 231-236, respectively.

Activity 1520 in FIG. 15 can include forming second conductive structures over second pillars of second memory cell strings of the memory device after first conductive structures are formed. The second conductive structures can be in electrical contact with respective pillars of the second pillars.

Forming the second conductive structures can include depositing a second conductive material in second holes. The second holes can be formed over respective pillars of the second pillars after the first material is deposited in the first holes.

The conductive structures in activity 1520 can include conductive structures 432, 434, and 436 (FIG. 4 and FIG. 5). The second pillars and second memory cell strings in activity 1520 can include pillars 542, 544, and 546 (FIG. 5) of memory cell strings 232, 234, and 236, respectively. Alternatively, the conductive structures in activity 1520 can include conductive structures 1341'-1346' (FIG. 14). The second pillars and the second memory cell strings in activity 1520 can alternatively include pillars 1351'-1356' (FIG. 14) of memory cell strings 231'-236', respectively.

Activity 1530 in FIG. 15 can include forming first data lines on a first level of the memory device and in electrical contact with respective conductive structures of the first conductive structures (in activity 1510). The first data lines can be formed before the second conductive structures (in activity 1520) are formed.

The first data line in activity 1530 can include data lines 271, 273, and 275 (FIG. 3 through FIG. 6). Alternatively, the first data line in activity 1530 can include data lines 1371-1376 (FIG. 13 and FIG. 14).

Activity 1540 in FIG. 15 can include forming second data lines on a second level of the memory device and in electrical contact with respective conductive structures of the second conductive structures (formed in activity 1520). The second data lines can be formed after the second data lines (in activity 1520) are formed.

The second data line in activity 1540 can include data lines 272, 274, and 276 (FIG. 3 through FIG. 6). Alternatively, the first data line in activity 1530 can include data lines 1371'-1376' (FIG. 13 and FIG. 14).

Method 1500 can include additional activities (not shown in FIG. 15) to form other elements coupled to the data lines (in activities 1530 and 1540). For example, method 1500 can include forming first conductive contacts over the first pillars (in activity 1510) and before the first conductive structures are formed. The first conductive contacts can be formed such that a respective conductive contact of the first conductive contacts can be located between and contacting a respective conductive structure of the first conductive structures and a respective pillar of the first pillars.

In another example, method 1500 can include forming second conductive contacts over the second pillars and before the second conductive structures are formed. The second conductive contacts can be formed such that a respective conductive contact of the second conductive contacts can be located between and contacting a respective conductive structure of the second conductive structures and a respective pillar of the second pillars.

Method 1500 can include additional activities that are omitted from method 1500 so as to not obscure the activities shown in FIG. 15. For example, method 1500 can include forming memory cells strings (including forming the pillars and pillar contacts) before the conductive contacts, the conductive structures, and the data lines are formed.

Providing the data lines (e.g., data lines 271-276, 271'-276', 1371-1376, and 1371'-1376') in a memory device as described above with reference to FIG. 1 through FIG. 15 can allow the memory device to have improvements and benefits, as mentioned above. For example, the data lines described herein can keep coupling capacitance between adjacent data lines at acceptable values for an increased number of data lines or for a decrease in the distance between adjacent data lines. This can maintain or improve the performance of the memory device described herein.

The illustrations of apparatuses (e.g., memory devices 100, 200, 800, 1000, 1200, and 1300) and methods (e.g., method (e.g., processes) 1500 of forming at least a portion of memory devices) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 800, 1000, 1200, and 1300) or a system (e.g., a computer, a cellular phone, or other electronic system) that includes a device such as any of memory devices 100, 200, 800, 1000, 1200, and 1300.

Any of the components described above with reference to FIG. 1 through FIG. 15 can be implemented in a number of ways, including simulation via software. Thus, apparatuses (e.g., memory devices 100 and 200 or part of each of these memory devices, including a control unit in these memory devices, such as control unit 118 (FIG. 1)) described above may all be characterized as "modules" (or "module") herein. Such modules may include hardware circuitry, single and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, 800, 1000, 1200, and 1300 may be included in apparatuses (e.g., electronic circuitry) such as high-speed computers, communication and signal processing circuitry, single or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 15 include apparatuses and methods of forming the apparatuses. One of the apparatuses includes a first pillar of a first memory cell string; a second pillar of a second memory cell string; a first conductive structure extending in a first direction, the first conductive structure located over and in electrical contact with the first pillar; a second conductive structure extending in the first direction, the second conductive structure located over and in electrical contact with the second pillar; a select gate coupled to the first and second memory cell strings; a first data line located on a first level of the apparatus and extending in a second direction, the first data line located over the first conductive structure and in electrical contact with the first conductive structure; and a second data line located on a second level of the apparatus and extending in the second direction, the second data line located over the second conductive structure and in electrical contact with the second conductive structure. Other embodiments including additional apparatuses and methods are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A. B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A. B, and C are listed, then the phrase "one of A, B and C" means A only; B only; or C only. Item A can include a single element or multiple elements. Item B can include a single element or multiple elements. Item C can include a single element or multiple elements. In the detailed description and the claims, a list of items joined by the term "at least one of" can mean any combination of the listed items. For example, if items A and B are listed, then the phrase "at least one of A and B" can mean A only; B only; or A and B. In another example, if items A, B. and C are listed, then the phrase "at least one of A, B and C" can mean A only; B only; C only; A and B (without C); A and C (without B); B and C (without A); or A. B, and C. Each of items A, B, and C can include a single element (e.g., a circuit element) or a plurality of elements (e.g., circuit elements).

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
   a first pillar of a first memory cell string;
   a second pillar of a second memory cell string;
   a first conductive structure extending in a first direction, the first conductive structure located over and in electrical contact with the first pillar;
   a second conductive structure extending in the first direction, the second conductive structure located over and in electrical contact with the second pillar;
   a select gate coupled to the first and second memory cell strings;
   a first data line located on a first level of the apparatus and extending in a second direction, the first data line located over the first conductive structure and in electrical contact with the first conductive structure;
   a second data line located on a second level of the apparatus and extending in the second direction, the second data line located over the second conductive structure and in electrical contact with the second conductive structure, wherein the select gate is located on a third level of the apparatus between memory cells of the first and second memory cell strings and the first level of the apparatus, and wherein the memory cells are located on multiple levels of the apparatus, and the third level is between the multiple levels and the first level, wherein
   the first pillar includes a first pillar contact, the first pillar contact being at a first vertical distance from the first data line; and
   the second pillar includes a second pillar contact, the second pillar contact being at a second vertical distance from the second data line, and the first distance being less than the second distance;
   a first conductive contact located between and contacting the first conductive structure and the first pillar contact; and
   a second conductive contact located between and contacting the second conductive structure and the second pillar contact.

2. The apparatus of claim 1, wherein the first data line includes a thickness in the first direction, a width in a third direction, and the width is less than the thickness.

3. The apparatus of claim 1, wherein the first data line includes a thickness in the first direction, a width in a third direction, and the width is greater than the thickness.

4. The apparatus of claim 1, further comprising:
   a first additional pillar of a first additional memory cell string;
   a second additional pillar of a second additional memory cell string;

a first additional conductive structure extending in the first direction and in electrical contact with the first additional pillar;
a second additional conductive structure extending in the first direction and in electrical contact with the second additional pillar, wherein:
the first data line is located over the first additional conductive structure and in electrical contact with the first additional conductive structure; and
the second data line is located over the second additional conductive structure and in electrical contact with the second additional conductive structure.

5. An apparatus comprising:
first data lines located on a first level of a memory device;
second data lines located on a second level of the memory device;
first memory cell strings, each of the first memory cell strings coupled to a respective data line of the first data lines and the second data lines;
second memory cell strings, each of the second memory cell strings coupled to a respective data line of the first data lines and the second data lines;
a first select gate coupled to the first memory cell strings;
a second select gate coupled to the second memory cell strings and electrically separated from the first select gate; and
access lines shared by the first memory cell strings and the second memory cell strings, wherein:
the first data lines include a first group of data lines, and a second group of data lines interleaved with the first group of data lines;
the first memory cell strings include a first row of pillars and a second row of pillars next to the first row of pillars;
the first row of pillars is coupled to the first group of data lines; and
the second row of pillars is coupled to the second group of data lines.

6. The apparatus of claim 5, further comprising a third select gate coupled to the first memory cell strings and the second memory cell strings.

7. The apparatus of claim 5, further comprising:
first conductive structures extending in a direction between the first data lines and the first memory cell strings; and
second conductive structures extending in a direction between the second data lines and the second memory cell strings, wherein each of the first conductive structures has a length less than a length of each of the second conductive structures.

8. The apparatus of claim 7, further comprising conductive contacts, wherein the first memory cell strings and the second memory cells include pillars, the pillars including pillar contacts, and each of the conductive contacts is located between and contacting a respective pillar contact of the pillar contacts and a respective conductive structure of the first conductive structures.

9. The apparatus of claim 5, wherein:
the second data lines include a third group of data lines, and a fourth group of data lines interleaved with the third group of data lines;
the second memory cell strings include a third row of pillars next to the second row of pillars and a fourth row of pillars next to the third row of pillars;
the third row of pillars is coupled to the third group of data lines; and
the fourth row of pillars is coupled to the fourth group of data lines.

* * * * *